(12) United States Patent
Ishii et al.

(10) Patent No.: US 10,270,531 B2
(45) Date of Patent: Apr. 23, 2019

(54) OPTICAL TRANSCEIVER AND METHOD OF MANUFACTURING THE SAME

(71) Applicant: Sumitomo Electric Industries, Ltd., Osaka-shi (JP)

(72) Inventors: Kuniyuki Ishii, Yokohama (JP); Hiromi Kurashima, Yokohama (JP)

(73) Assignee: Sumitomo Electric Industries, Ltd., Osaka-shi (JP)

(*) Notice: Subject to any disclaimer, the term of this patent is extended or adjusted under 35 U.S.C. 154(b) by 0 days.

(21) Appl. No.: 15/907,641

(22) Filed: Feb. 28, 2018

(65) Prior Publication Data

US 2018/0254831 A1 Sep. 6, 2018

(30) Foreign Application Priority Data

Mar. 1, 2017 (JP) ................... 2017-038689
Mar. 1, 2017 (JP) ................... 2017-038695
Mar. 1, 2017 (JP) ................... 2017-038698

(51) Int. Cl.
| | | |
|---|---|---|
| *H05K 1/02* | (2006.01) | |
| *H05K 1/03* | (2006.01) | |
| *H05K 1/14* | (2006.01) | |
| *H04B 10/40* | (2013.01) | |
| *H04B 10/58* | (2013.01) | |
| *H04B 10/66* | (2013.01) | |

(52) U.S. Cl.
CPC ............ *H04B 10/40* (2013.01); *H04B 10/58* (2013.01); *H04B 10/66* (2013.01); *H05K 1/0274* (2013.01); *H05K 1/0393* (2013.01); *H05K 1/147* (2013.01); *H05K 2201/10121* (2013.01)

(58) Field of Classification Search
None
See application file for complete search history.

(56) References Cited

U.S. PATENT DOCUMENTS

| | | | |
|---|---|---|---|
| 2005/0018978 A1* | 1/2005 | Nevo | G02B 6/4246 385/92 |
| 2006/0093287 A1* | 5/2006 | Yoshikawa | G02B 6/4201 385/92 |
| 2009/0162051 A1* | 6/2009 | Hudgins | H04B 10/40 398/9 |
| 2012/0148201 A1* | 6/2012 | Kondou | G02B 6/4245 385/92 |

FOREIGN PATENT DOCUMENTS

JP      2016-057567 A      4/2016

* cited by examiner

*Primary Examiner* — Darren E Wolf
(74) *Attorney, Agent, or Firm* — Baker Botts L.L.P.; Michael A. Sartori

(57) ABSTRACT

An optical transceiver includes: a TOSA that converts an electrical signal into an optical signal; an ROSA that converts an optical signal into an electrical signal; a receptacle that houses an external optical connector for transmitting or receiving an optical signal through the external optical connector; an internal fiber that optically connects one of the ROSA and the TOSA to the receptacle; a circuit board that includes a circuit that is electrically connected to the TOSA and the ROSA via an FPC; a holding member that is attached to the circuit board and holds the ROSA and the TOSA; and a housing that houses the TOSA, the ROSA, the receptacle, the internal fiber, the circuit board, and the holding member. The holding member includes a plurality of guides that guide the internal fiber.

17 Claims, 23 Drawing Sheets

OPTICAL TRANSCEIVER AND METHOD OF MANUFACTURING THE SAME

TECHNICAL FIELD

An aspect of the invention relates to an optical transceiver and a method of manufacturing an optical transceiver.

BACKGROUND

Japanese Unexamined Patent Publication No. 2016-57567 discloses an optical transceiver which houses a printed circuit board, one ROSA, and four TOSAs in a housing. The TOSAs are arranged in parallel. The printed board is provided to the rear of the TOSAs and the ROSA. The TOSAs and the ROSA are electrically connected to the printed board via FPCs (Flexible Printed Circuits). The FPCs are attached to the components by soldering terminals (electrodes) thereof Reducing the pitch between the terminals may cause electrical connection to be damaged due to a stress which is greater than the soldering strength. In the optical transceiver, optical components are optically connected by optical fiber cables. When the number of optical components increase, increasing of the number of optical fiber cables causes guiding of the optical fiber cables in the optical transceiver to be complicated. Also, increasing of the number of components accommodated causes the productivity for the optical transceiver to deteriorate because of a complicated internal configuration.

SUMMARY

According to an aspect of the invention, there is provided an optical transceiver including: an optical sub assembly (OSA) configured to perform photoelectric conversion between an optical signal and an electrical signal; a flexible printed circuit (FPC) configured to transmit the electrical signal; a circuit board including a circuit that is electrically connected to the OSA via the FPC a holding member that is attached to the circuit board and holds the OSA; an internal fiber for transmitting the optical signal; a receptacle that is optically connected to the OSA via the internal fiber and configured to receive an external optical connector for transmitting or receiving the optical signal, and a housing that houses he OSA, the FPC, the circuit board, the holding member, the internal fiber, and the receptacle.

According to another aspect of the invention, there is provided an optical transceiver including: a TOSA that converts a first electrical signal into an a first optical signal; an ROSA that converts an second optical signal into a second electrical signal; a receptacle that receives an external optical connector for transmitting the first optical signal or receiving the second optical signal via the external optical connector; an internal fiber that optically connects one of the ROSA and the TOSA to the receptacle; a circuit board includes a circuit that processes the first electrical signal and the second electrical signal; and a holding member that is attached to the circuit board and holds the ROSA and the TOSA, wherein the holding member includes a plurality of guides that guides the internal fiber.

According to another aspect of the invention, there is provided a method of manufacturing an optical transceiver including a circuit board, an optical sub assembly (OSA), a holding member that is attached to the circuit board and holds the OSA, and an internal fiber that optically connects the OSA to an optical component, the method including: a first step of electrically connecting the circuit board and the OSA to each other; a second step of optically connecting the internal fiber to a simple connector attached to the OSA; a third step of attaching the holding member to the circuit board while holding the OSA; a fourth step of housing the internal fiber in a guide that is provided in the holding member; and a fifth step of housing the optical component in the holding member.

DETAILED DESCRIPTION

Hereinafter, an optical transceiver and a manufacturing method thereof according to an embodiment of the invention will be described in detail with reference to the accompanying drawings. In description with reference to the drawings, the same or corresponding elements will be referenced by the same reference signs and duplicate description will be omitted.

Figure 1:
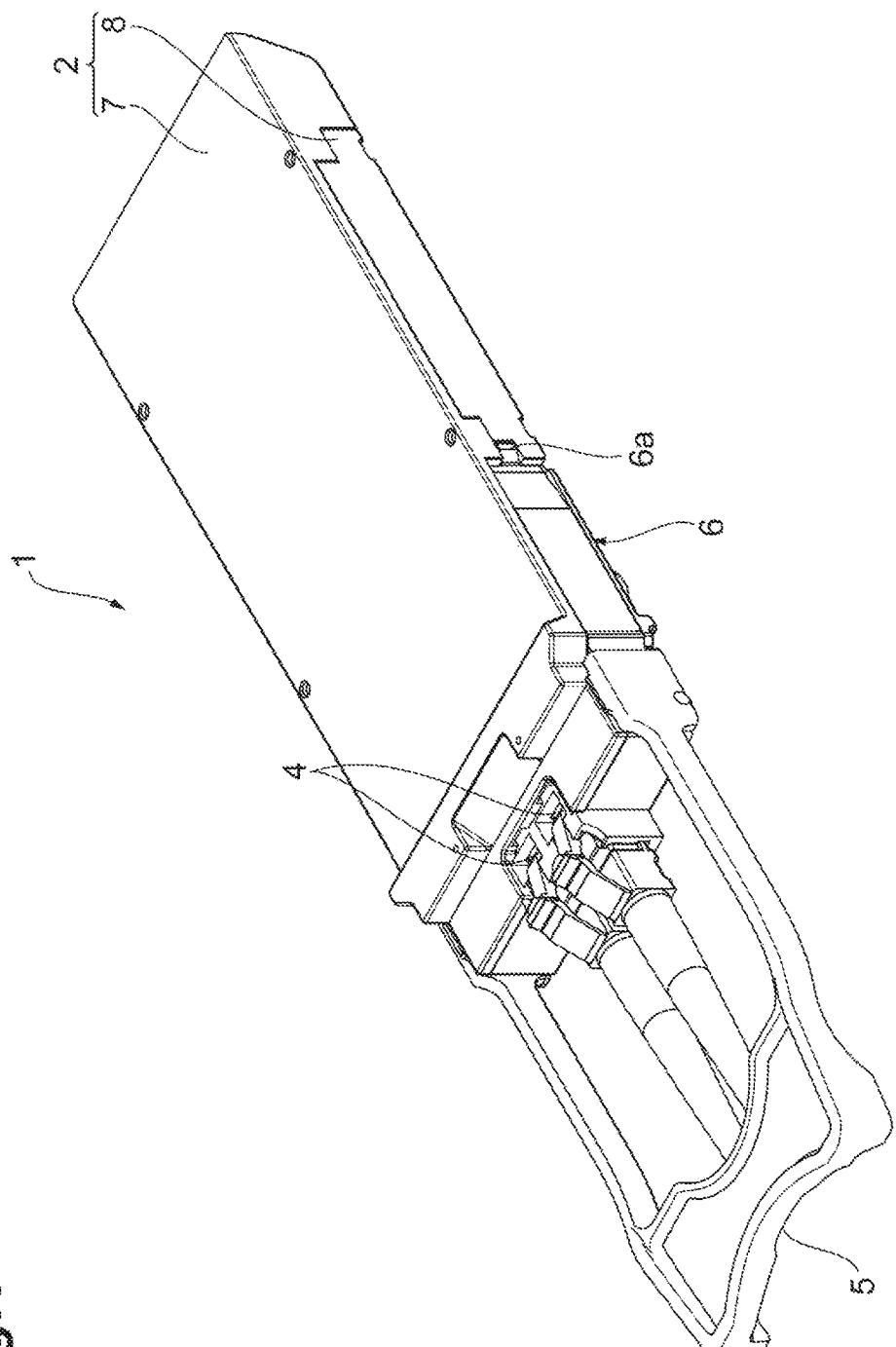
FIG. 1 is a perspective view illustrating an optical transceiver according to an embodiment.

FIG. 1 is a perspective view illustrating an optical transceiver 1 according to an embodiment. The optical transceiver 1 is a so-called CFP8 module. Standard specifications of CFP8 modules have been determined in the industry. In the optical transceiver 1, NRZ signals with a signaling rate of 25 Gbps are multiplexed into a four-value pulse amplitude modulation (PAM) signal, that is, a PAM4 signal (with multiplicity of two). For example, in a TOSA (Transmitter Optical Sub-Assembly) which will be described later, driving a single semiconductor laser using a PAM4 signal enables a transmission rate to reach to 50 Gbps per wavelength. One TOSA contains four semiconductor lasers and outputs four optical signals with different wavelengths. Hereinafter, a stream from a plurality of electrical signals to a corresponding optical signal which is transmitted by the optical transceiver 1 is referred to as a lane. That is, one TOSA can handle four lanes and can perform signal transmission of 200 Gbps (50 Gbps×four wavelengths). Also, one ROSA (Receiver Optical Sub-Assembly) can handle four lanes for converting an optical signal into a plurality of electrical signals and can perform signal transmission of 200 Gbps similarly to the TOSA. Accordingly, by mounting two OSAs (which are collectively referred to as a TOSA and an ROSA) with a transmission rate of 200 Gbps, eight lanes in total can be handled and a transmission capacity of 400 Gbps is achieved.

The optical transceiver 1 includes a housing 2. The housing 2 includes an upper housing 7 and a lower housing 8. External dimensions of the housing 2 are based on CFP8 MSA (Multi-Source Agreement) which is an industrial standard. For example, the length of the housing 2 is 106 mm, the width of the housing 2 is 40 mm, and the height of the housing 2 is 9.5 mm.

A receptacle 4 which can receive an external optical connector is provided in the housing 2. An optical connector is, for example, an LC connector. In the following description, directions such as "forward-rearward," "up-down," and "right-left" are used for the drawings, but these terms refer to convenient directions based on states illustrated in the drawings. In the following description, the upward direction is a direction from which the upper housing 7 is mounted on the lower housing 8. The forward direction is a direction from which the receptacle 4 is disposed in the housing 2. The right-left direction is a width direction of the housing 2 which is perpendicular to the up-down direction and the forward-rearward direction.

Two of the receptacle 4 are formed in parallel at the center in the right-left (width) direction of the housing 2. Arms of a pull tab 5 extend forward from both the right and left sides of the housing 2. The optical transceiver 1 includes a slider 6 on both the right and left sides of the housing 2. Each slider 6 slides in conjunction with movement in the forward-rearward direction of the corresponding pull tab 5. The slider 6 includes a protrusion 6a at the rear end thereof. The protrusion 6a has a function to push out a tab which is formed in a cage of a host system. When the slider 6 slides forward, the protrusion 6a pushes the tab outward on both the right and left sides and thus the tab and the housing 2 are disengaged from each other. In this way, pulling the pull tab 5 forward allows the optical transceiver 1 to be detached from the cage. As described above, the height of the housing 2 is about 10 mm which is slightly larger than a width of the slider 6 (the length in the up-down direction in FIG. 1). Accordingly, it is possible to enhance a housing density of the optical transceiver 1 with respect to the host system.

Figure 2:
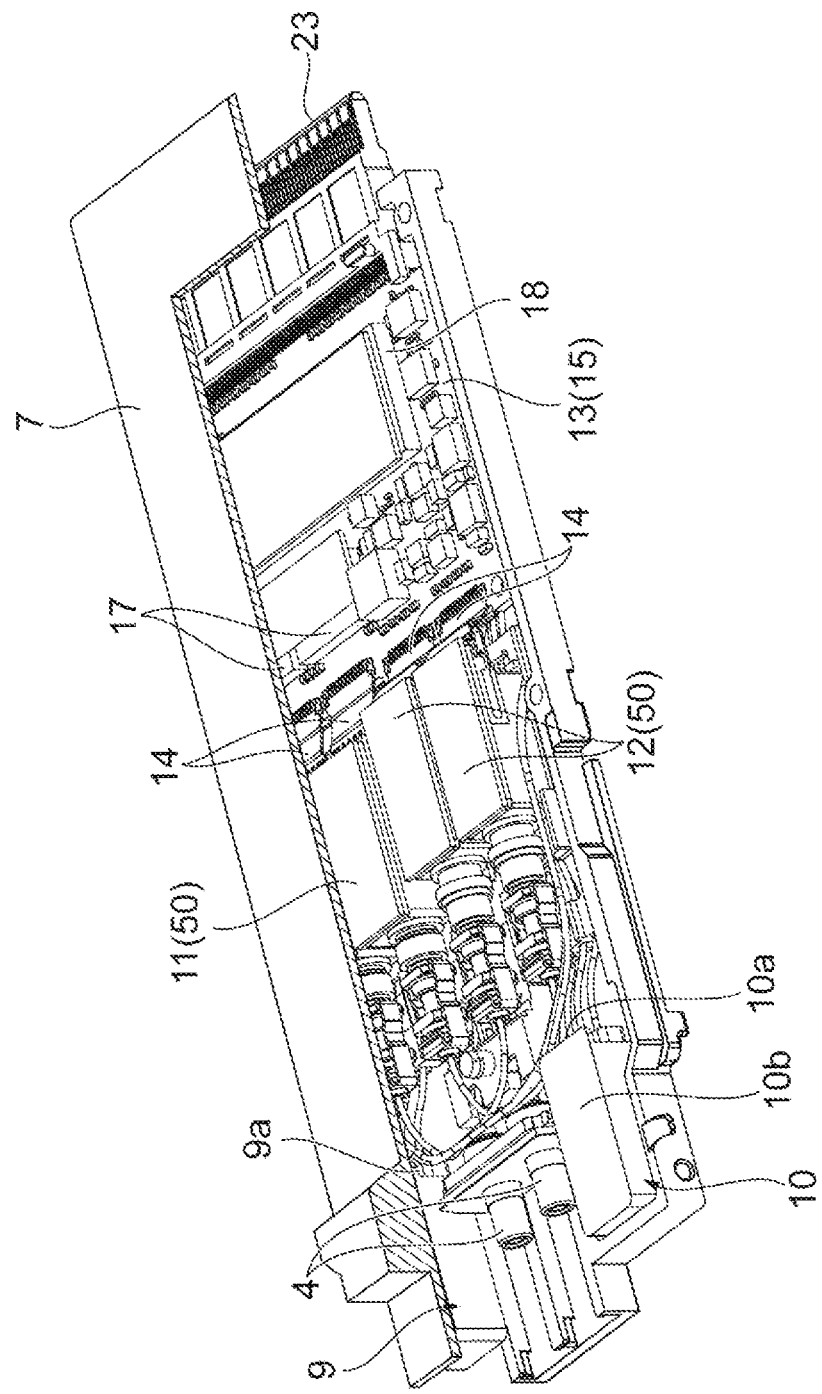
FIG. 2 is a perspective view illustrating an internal structure of the optical transceiver illustrated in FIG. 1.
Figure 3:
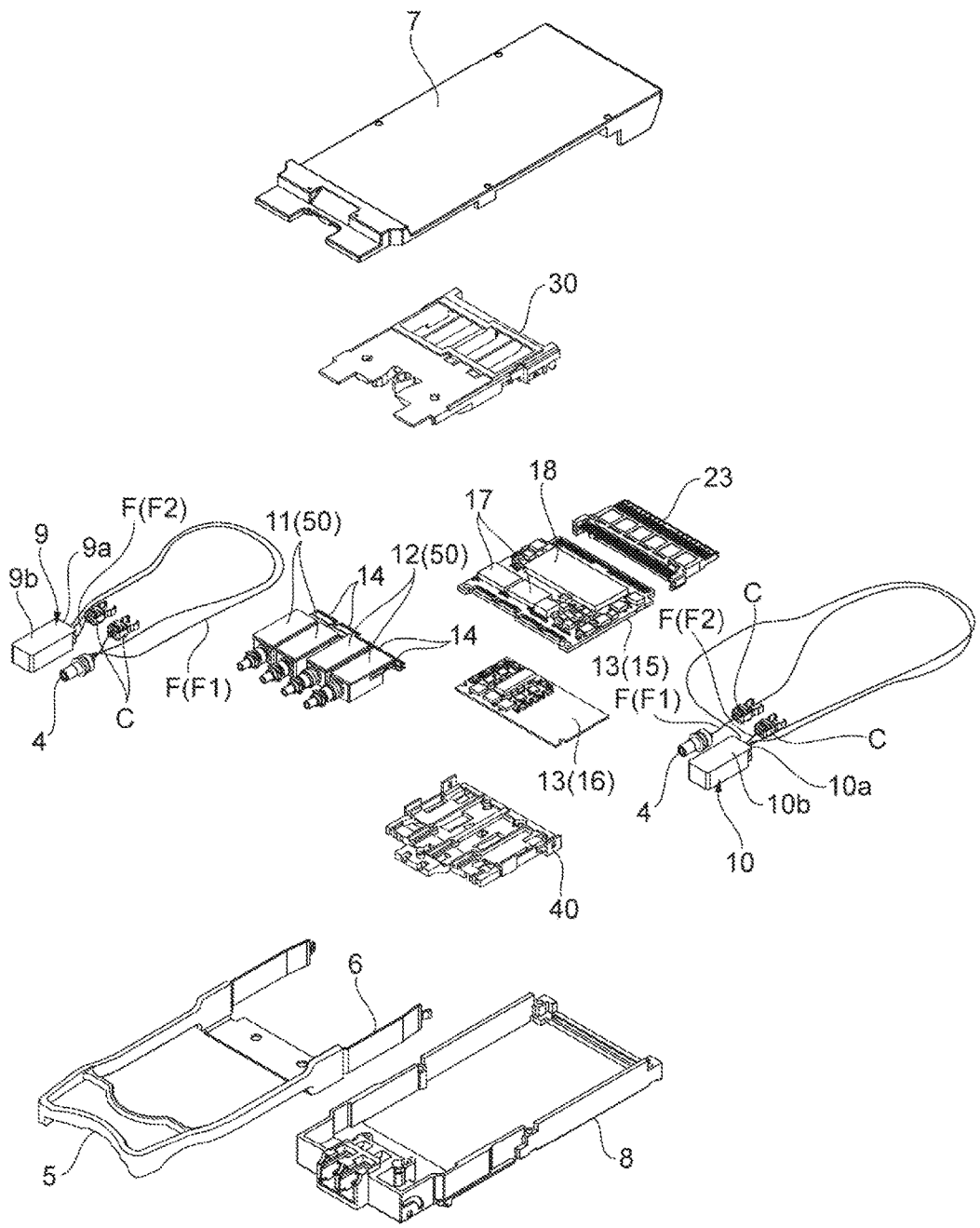
FIG. 3 is an exploded perspective view of the optical transceiver illustrated in FIG. 1.

FIG. 2 is a perspective view illustrating an internal structure of the optical transceiver 1 in which a part of the upper housing 7 is cut away. FIG. 3 is an exploded perspective view of the optical transceiver 1. The upper housing 7 houses the receptacle 4, an optical multiplexer (O-Mux) 9 and an optical demultiplexer (O-DeMux) 10 which are located on both the right and left sides of the receptacle 4, two TOSAs 11, two ROSAs 12, a circuit board (a printed board) 13, and an FPC 14.

In the optical transceiver 1, a transmission part handles optical signals with different wavelengths of eight lanes for transmission. In the optical transceiver 1, a reception part handles optical signals with different wavelengths of eight lanes for reception. The optical demultiplexer 10 separates (demultiplexes) a wavelength-multiplexed optical signal into two sub multiplexed optical signals. The wavelength-multiplexed optical signal includes optical signals of eight lanes. One of the two sub multiplexed optical signals includes optical signals of four lanes on a long wavelength side. Another of the two sub multiplexed optical signals includes optical signals of other four lanes on a short wavelength side. In the reception part, the two sub multiplexed optical signals are optically connected to the two ROSAs 12, respectively. The optical multiplexer 9 multiplexes the two sub multiplexed optical signals (of four lanes for each) into a single wavelength-multiplexed optical signal (of eight lanes). In the transmission part, the two sub multiplexed optical signals are optically connected to the two TOSAs 11, respectively. In the following description, the TOSA 11 and the ROSA 12 may be collectively referred to as an optical sub assembly (OSA) 50.

The receptacle 4 is optically connected to an OSA 50 via an internal fiber F and a simple connector C. More specifically, one internal fiber F extending from the receptacle 4 for transmission and two internal fibers F extending to the TOSAs 11 are optically connected to the optical multiplexer 9. Two internal fibers F extending from the ROSAs 12 and one internal fiber F extending to the receptacle 4 for reception are optically connected to the optical demultiplexer 10. Here, optical connection means that optical waveguides, optical coupling systems, and the like are constituted such that the wavelength-multiplexed optical signal and the sub multiplexed optical signals are appropriately transmitted through them.

Two TOSAs 11 and two ROSAs 12 are disposed to the rear of the optical multiplexer 9 and the optical demultiplexer 10. These OSAs 50 perform photoelectric conversion between an optical signal and an electrical signal. Two internal fibers F extending from the optical multiplexer 9 are optically connected to the two TOSAs 11 via the simple connectors C. Two internal fibers F extending from the optical demultiplexer 10 are optically connected to the two ROSAs 12 via the simple connectors C. Each internal fiber F extending to each OSA 50 is optically connected to an optical connection unit of each OSA 50. The optical connection unit includes optical components such as a lens and an isolator.

The optical multiplexer 9 and the optical demultiplexer 10 have, for example, the same shape and the same external dimensions. The optical multiplexer 9 and the optical demultiplexer 10 include protruding portions 9a and 10a that protrude rearward at bottoms 9b and 10b thereof. Three internal fibers F extends out from each of the optical multiplexer 9 and the optical demultiplexer 10 in a pigtail manner. That is, the internal fibers F are optically connected to an optical system in each of the optical multiplexer 9 and the optical demultiplexer 10 without optical connectors. The internal fibers F drawn out in a pigtail manner are permanently connected to the optical multiplexer 9 or the optical demultiplexer 10 and cannot be easily detached therefrom.

The internal fiber F includes a first internal fiber F1 and a second internal fiber F2. Each of the optical multiplexer 9 and the optical demultiplexer 10 is optically connected to the receptacle 4 via the first internal fiber F1. Each of the optical multiplexer 9 and the optical demultiplexer 10 is connected to a simple connector C via the second internal fiber F2.

Each OSA 50 is mounted on the circuit board (the printed board) 13 via a first holding member 30 and a second holding member 40 which will be described later. Accordingly, connection between the FPC 14 connected to each OSA 50 and the circuit board 13 can be protected (reinforced) from stress. Accordingly, it is possible to enhance reliability of electrical connection. The circuit board 13 has a circuit that is electrically connected to an OSA 50 via the FPC 14 mounted thereon. The circuit board 13 is disposed to the rear of the OSAs 50. The circuit board 13 includes a first circuit board 15 which is located on an upper side thereof and a second circuit board 16 which is located on a lower side thereof. Two LD drivers 17 facing two TOSAs 11, a digital signal processor (DSP) 18, a preamplifier IC, and the like are mounted on the first circuit board 15. The DSP 18 is mounted at the center of the first circuit board 15. The DSP 18 is a signal processing IC and performs signal processing on eight electrical signals on a transmission side (in the transmission part) and eight electrical signals on a reception side (in the reception part). The DSP 18 converts, for example, two NRZ signals of 25 Gbps into a PAM4 signal.

The second circuit board 16 is electrically connected to the first circuit board 15 located thereabove with a stack connector. The stack connector allows electrical connection to save more space than a case in which an FPC is used. Also, the stack connector can handle electrical signals of higher rates. For example, the first circuit board 15 has circuit components mounted on both surfaces thereof (double-sided mounting). The second circuit board 16 has circuit components mounted on only the top surface thereof (single-sided mounting).

The optical transceiver 1 includes a plug board 23 other than the circuit board 13 to the rear of the circuit board 13. The plug board 23 engages with an electrical connector which is provided in the cage of the host system (a transmission apparatus). One hundred or more electrodes are densely arranged on the electrical connector and the plug board 23. Engagement allows the electrodes of the electrical connector and the electrodes of the plug board 23 to be electrically connected to each other. In order to correctly connect the corresponding electrodes, a relative position between the electrical connector and the plug board 23 needs to be accurately determined.

Accordingly, increasing of an engaging force between the electrical connector and the plug board 23 can secure the relative position between the electrical connector and the plug board 23, but also can increase a disengaging force of the optical transceiver 1 from the electrical connector. In order to prevent a stress applied to the plug board 23 from being applied to the circuit board 13 at the time of disengagement of the optical transceiver 1 and in order to cause the plug board 23 to strongly engage with the electrical connector, the plug board 23 is mechanically separated from the circuit board 13.

Figure 4:
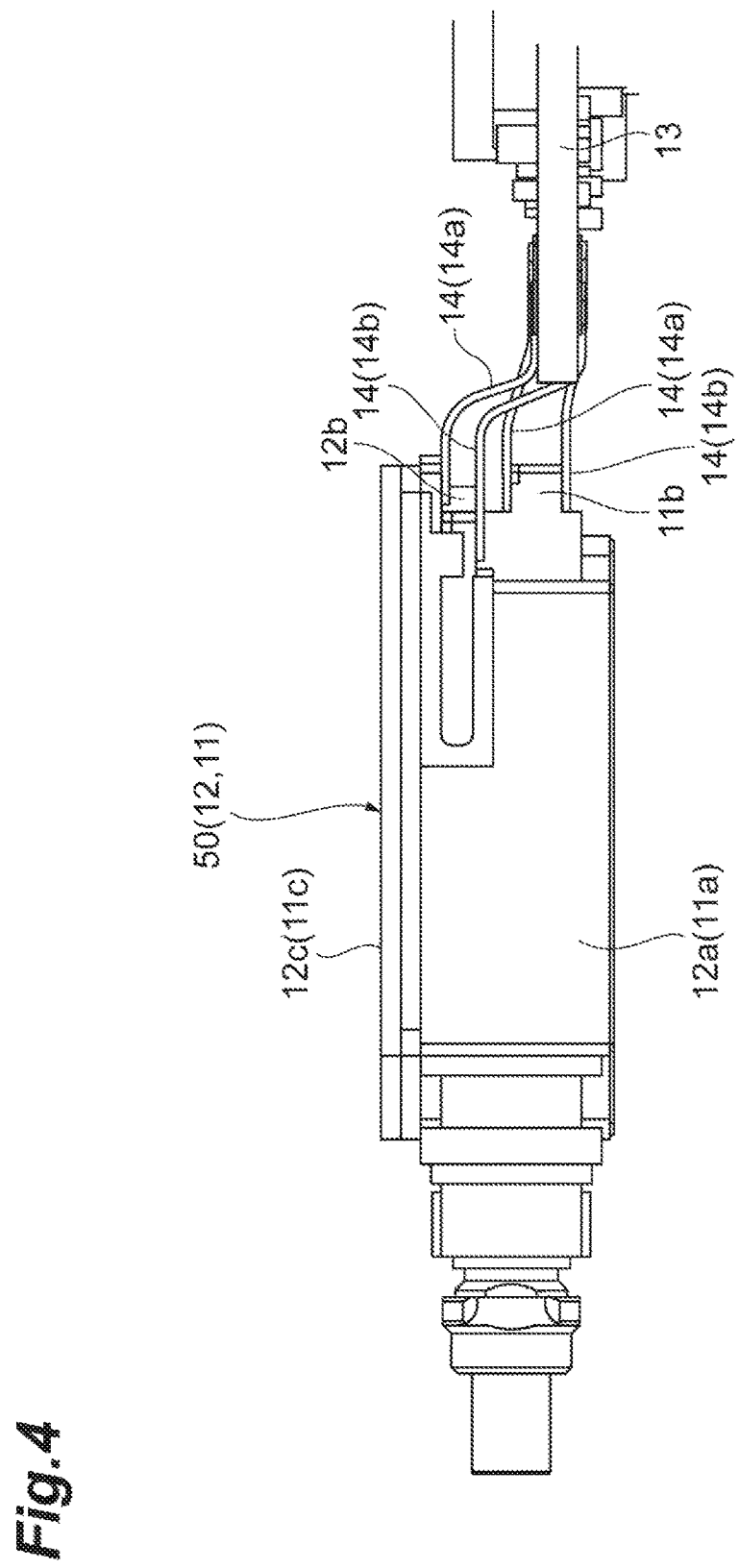
FIG. 4 is a side view illustrating an OSA, an FPC, and a circuit board.

As illustrated in FIG. 4, the OSAs 50 include packages 11a and 12a with a rectangular parallelepiped shape and terminals 11b and 12b which extend out of only the rear side thereof. The packages 11a and 12a include the terminals 11b and 12b on only the side opposite to the receptacle 4 in the longitudinal direction of the optical transceiver 1. Bottom surfaces 11c and 12c of the packages 11a and 12a touch (come into contact with) the inner surface of the upper housing 7. That is, the OSAs 50 are mounted in the upper housing 7 in an upside-down state.

Figure 5:
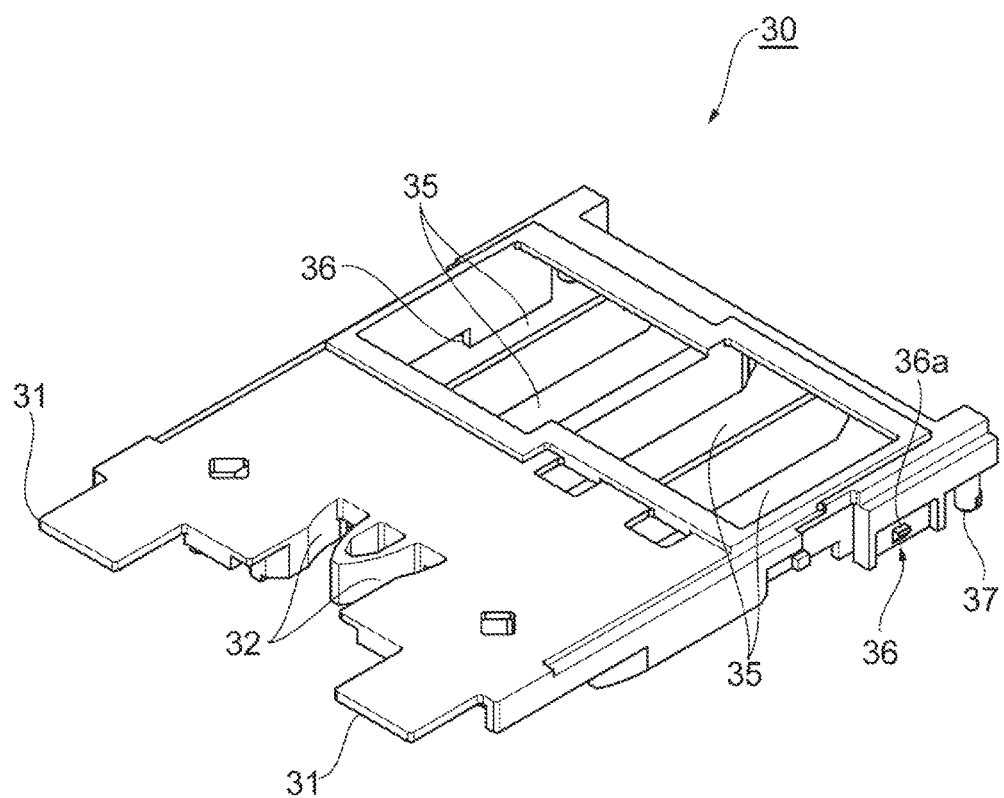
FIG. 5 is a perspective view illustrating a first holding member which is included in the optical transceiver illustrated in FIG. 1.
Figure 6:
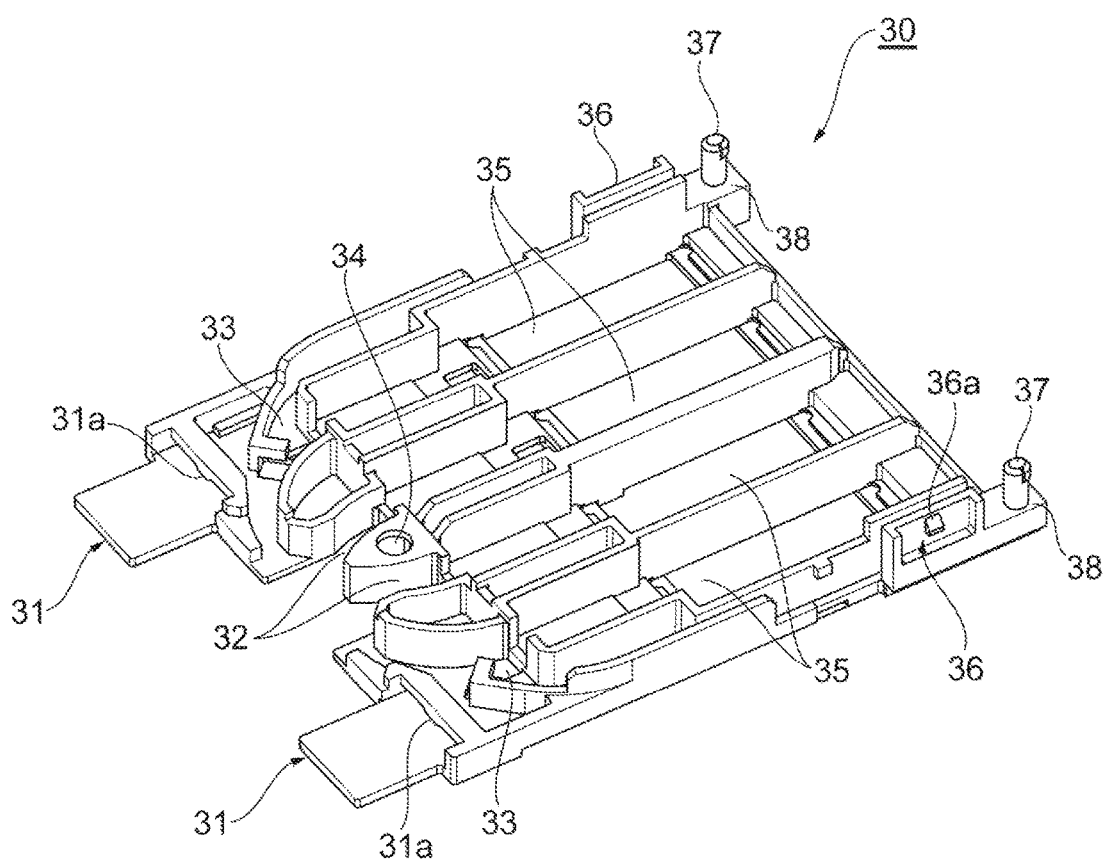
FIG. 6 is a perspective view of the first holding member illustrated in FIG. 5 when viewed from a side opposite to that in FIG. 5.

FIGS. 5 and 6 are perspective views illustrating the first holding member 30. The first holding member 30 has a rectangular appearance. The first holding member 30 includes a protruding portion 31, grooves 32 and 33, hole portions (opening) 34 and 35, an engaging portion 36, a protrusion 37, and a protruding portion 38 sequentially from the front side. The protruding portion 31 is provided on both the right and left sides of the first holding member.

The grooves (guides) 32 and 33 are guide grooves in which the internal fibers F are disposed. The grooves 32 and 33 guide the internal fibers F to pass through predetermined paths. The grooves 32 are provided on inner sides in the right-left direction of the first holding member 30. The grooves 33 are provided on outer sides in the right-left direction of the first holding member 30. The grooves 32 and 33 are formed on the inner surface of the first holding member 30. The internal fibers F which extend out of the optical multiplexer 9 and the optical demultiplexer 10, are detoured (bent and folded back with a large radius of curvature) in the rear part of the upper housing 7, and further extend to the simple connectors C are inserted into the grooves 32 and 33.

The hole portion 34 is a hole that is used to cause the first holding member 30 to engage with the second holding member 40. The hole portion 34 has a circular sectional shape. The hole portion (opening) 35 exposes the bottom surfaces 11c and 12c of the OSAs 50 from the first holding member 30. The engaging portion 36 is a portion that is used to cause the first holding member 30 to engage with the second holding member 40. The engaging portion 36 is provided in the rear parts of both the right and left side walls of the first holding member 30. The protrusion 37 is a portion that is used to cause the first holding member 30 to engage with the circuit board 13, and is provided in the protruding portions 38 that extend rearward from both lateral ends of the first holding member 30.

Temporary fixing the optical multiplexer 9 and the optical demultiplexer 10 onto the protruding portions 31 enables the optical transceiver to be assembled efficiently. A concave portion 31a is formed rearward in the base of each protruding portion 31. Inserting protruding portions 9a and 10a of the optical multiplexer 9 and the optical demultiplexer 10 into the concave portions 31a allows the optical multiplexer 9 and the optical demultiplexer 10 to be temporarily fixed onto the protruding portions 31. The protruding portions 9a and 10a will be described later.

The optical multiplexer 9, the optical demultiplexer 10, and the OSAs 50 are integrally temporarily held in the first holding member 30. Assembling such an intermediate assembly enables efficiency of assembly to be improved.

An example of a component that is mounted in an OSA 50 and requires heat dissipation is a thermoelectric cooler (TEC). Particularly, a bottom surface of the TEC requires heat dissipation to radiate absorbed heat when a semiconductor element emitting heat is cooled by a Peltier effect. The bottom surfaces of the TECs are located on the bottom surfaces 11c and 12c of the OSAs 50. Accordingly, physically bringing the bottom surfaces 11c and 12c of the OSAs 50 into surface contact with the inner surface of the upper housing 7 through the hole portion 35 allows heat dissipation properties of the OSAs 50 to be enhanced.

The areas of the bottom surfaces 11c and 12c of the OSAs 50 may be set to be greater than the areas of the hole portions (opening) 35. Such setting of the areas prevents each OSA 50 from falling out of the corresponding hole portion 35. However, in this state, a gap is formed between the bottom surfaces 11c and 12c and the inner surface of the upper housing 7, thereby deteriorating heat dissipation properties. Accordingly, filling the gap with a heat dissipating member of a gel type and setting the thickness of the heat dissipating member to be larger than the thickness of the first holding member 30 causes the OSAs 50 to come into surface contact with the inner surface of the upper housing 7 with the heat dissipating member interposed therebetween. Accordingly, a heat dissipation path with good thermal conductivity from the OSAs 50 to the upper housing 7 is secured.

Figure 7:
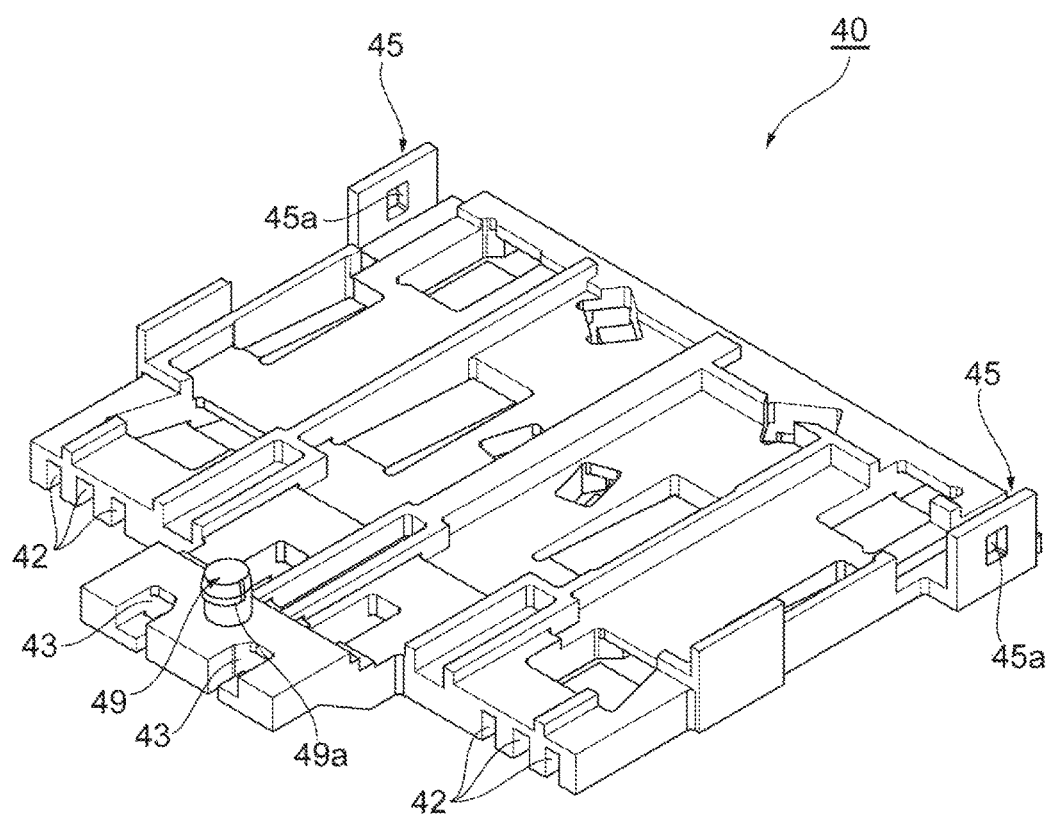
FIG. 7 is a perspective view illustrating a second holding member which is included in the optical transceiver illustrated in FIG. 1.
Figure 8:
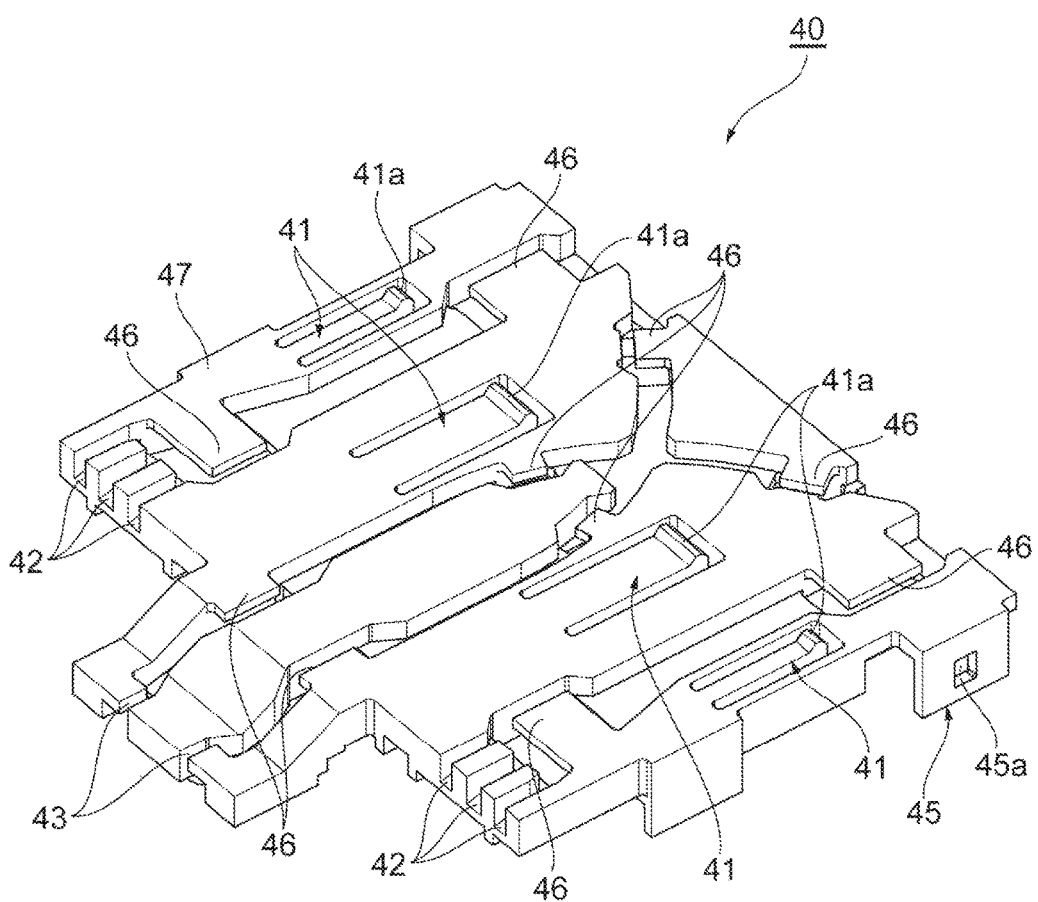
FIG. 8 is a perspective view of the second holding member illustrated in FIG. 7 when viewed from a side opposite to that in FIG. 7.

FIGS. 7 and 8 are perspective views illustrating the second holding member 40. The second holding member 40 has a rectangular shape. The second holding member 40 includes protruding portions 41, grooves 42 and 43, protruding portions 45 and 46, and a protrusion 49. The protruding portions 41 are provided in parts on which the OSAs 50 are mounted. Each protruding portion 41 has an elastic force for pressing the corresponding OSA 50 onto the upper housing 7.

Each protruding portion 41 is a stress applying portion that presses the corresponding OSA 50 onto the inner surface of the upper housing 7. Each protruding portion 41 includes a protrusion 41a at the tip thereof. The protrusion 41a has a triangular sectional shape. Bending the protrusion 41a causes an elastic force of the corresponding protruding portion 41 with respect to the corresponding OSA 50. Causing the protruding portion 41 to press the OSA 50 onto the upper housing 7 allows the bottom surfaces 11c and 12c of the OSAs 50 to be securely brought into contact with the inner surface of the upper housing 7.

When the second holding member 40 is assembled into the first holding member 30, the overall height of the first holding member 30 and the second holding member 40 is slightly less than the overall height of the OSAs 50. Accordingly, when the areas of the bottom surfaces 11c and 12c of the OSAs 50 are greater than the areas of the hole portions 35, the bottom surfaces 11c and 12c of the OSAs 50 protrude securely from the hole portions (opening) 35 to the upper housing 7. Accordingly, when the overall height of the first holding member 30 and the second holding member 40 is set to be slightly less than the overall height of the OSAs 50, the OSAs 50 can be securely brought into contact with the inner surface of the upper housing 7 for providing better heat radiation.

The protruding portions 45 engages with the engaging portions 36 of the first holding member 30. The protrusion 49 engages with the hole portion 34 of the first holding member 30. Accordingly, the second holding member 40 engages with the first holding member 30 at three locations including the protrusion 49 and a pair of protruding portions 45. A hole portion 45a is formed in each protruding portion 45. A protrusion 36a is formed in each engaging portion 36. Fitting the protrusions 36a to the hole portions 45a enables the first holding member 30 and the second holding member 40 to engage strongly with each other at two locations on the rear side.

The protrusion 49 is formed in a columnar shape. The diameter of the tip of the protrusion 49 is larger than the diameter of the base thereof. That is, the protrusion 49 includes a diameter-increased portion 49a at the tip thereof. The diameter-increased portion 49a prevents the protrusion 49 from falling out of the hole portion 34. Accordingly, engagement between the protrusion 49 and the hole portion 34 enables the first holding member 30 and the second holding member 40 to engage strongly with each other at one location on the front side.

The grooves (guides) 42 and 43 are guide grooves that guide the internal fibers F. Three grooves 42 are formed on each outside of the front-right and front-left sides of the second holding member 40. Two grooves 43 are formed on each inside of the front-right and front-left sides of the second holding member 40. Each groove 43 faces the receptacle 4 and guides the first internal fiber F1 extending from the receptacle 4. The grooves 42 face the optical multiplexer 9 and the optical demultiplexer 10. The grooves 42 guide one first internal fiber F1 and two second internal fibers F2 extending to the optical multiplexer 9 and the optical demultiplexer 10. The grooves 43 guide two first internal fibers F1 extending to the receptacle 4.

The grooves 42 and 43 are formed on the bottom surface 47 of the second holding member 40. Three grooves 42 on the right side extend straightly from the front side of the second holding member 40 to the rear side thereof and then merge with each other. Three grooves 42 on the left side extend straightly from the front side of the second holding member 40 to the rear side thereof and then merge with each other. Two grooves 43 extend straightly from the front side of the second holding member 40 to the rear side thereof and cross each other and extend in the opposite directions in the right-left direction in the rear part of the second holding member 40. The grooves 42 pass inside two outer protruding portions 41 and outside two inner protruding portions 41 among the four protruding portions 41. Accordingly, the widths of the two outer protruding portions 41 are less than the widths of the two inner protruding portions 41 so as to pass the grooves 42. A plurality of protruding portions 46 are provided in the grooves 42 and 43. The protruding portions 46 prevent the internal fibers F guided in the grooves 42 and 43 from jumping out of the grooves. The OSAs 50 are interposed between the first holding member 30 and the second holding member 40.

Figure 9:
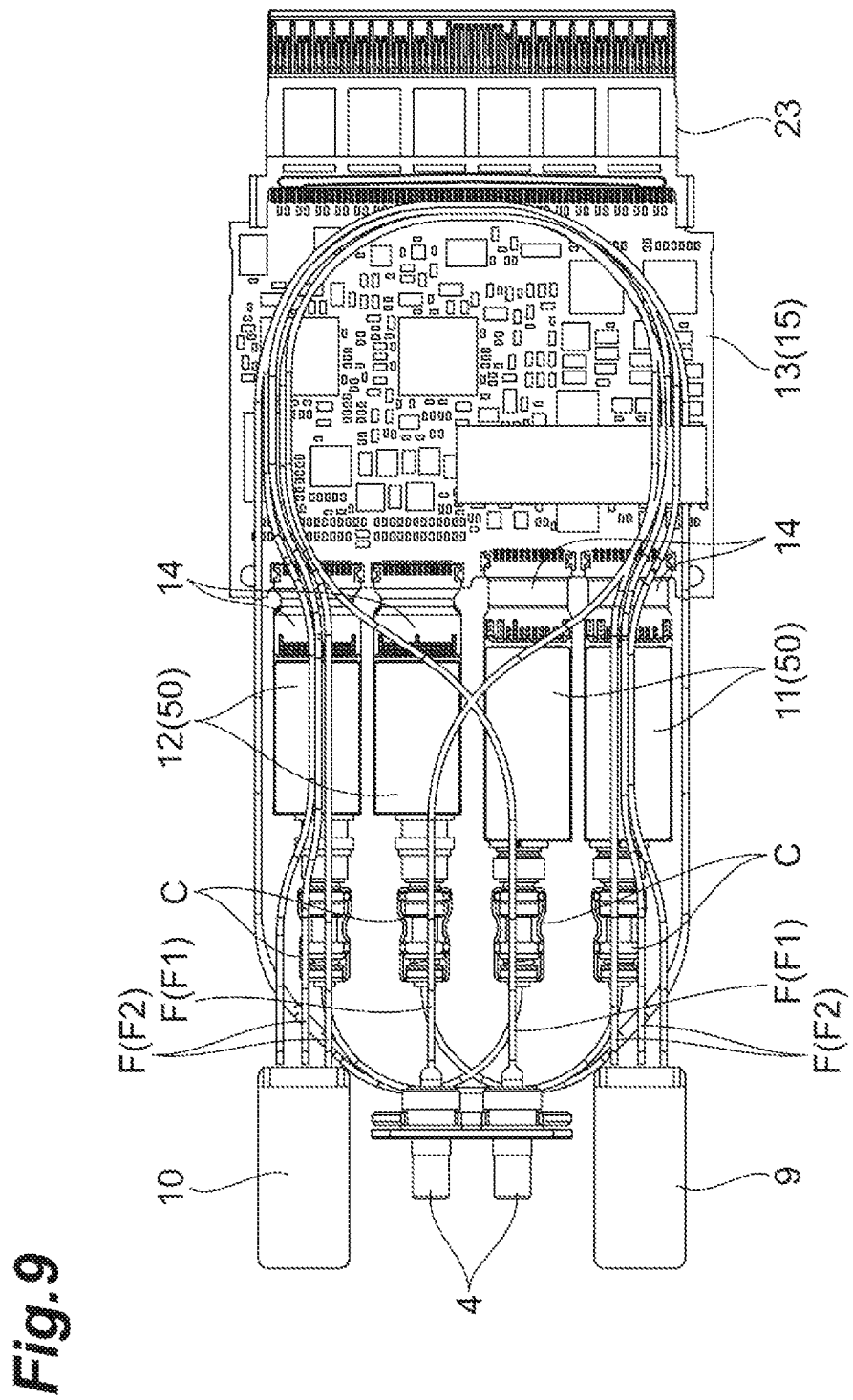
FIG. 9 is a plan view illustrating components of the optical transceiver illustrated in FIG. 1.

FIG. 9 is a diagram illustrating guiding (a path) of the internal fibers F. In FIG. 9, the first holding member 30 and the second holding member 40 are not illustrated. The first internal fibers F1 drawn out of the receptacle 4 extend straightly to the rear side, is curved to the opposite sides in the right-left direction above the OSAs 50 (on the outer surface of the second holding member 40), is greatly curved to the opposite sides and folded back on the circuit board 13 while maintaining the curvature, passes above the outer OSAs 50 on the right and left sides, and are connected to the optical multiplexer 9 and the optical demultiplexer 10.

Two second internal fibers F2 drawn out of the optical multiplexer 9 and the optical demultiplexer 10 are guided to the inner grooves 42 on the right and left sides out of three grooves 42, extend straightly to the rear side, are greatly curved to the opposite sides in the right-left direction and folded back above the circuit board 13, are drawn forward along the wall portions of the engaging portions 36 at the rear end of the first holding member 30, are curved outside the wall portions which are provided on the outermost of the grooves 33 of the first holding member 30, extend to the rear side, are guided to the grooves 32 and 33, and are connected to the simple connectors C. Curving the second internal fibers F2 along the wall portions at the outermost of the grooves 33 allows the curvature of the bending of the second internal fibers F2 to be reduced. The curvature of the second internal fibers F2 is less than, for example, 20 mm.

Figure 10:
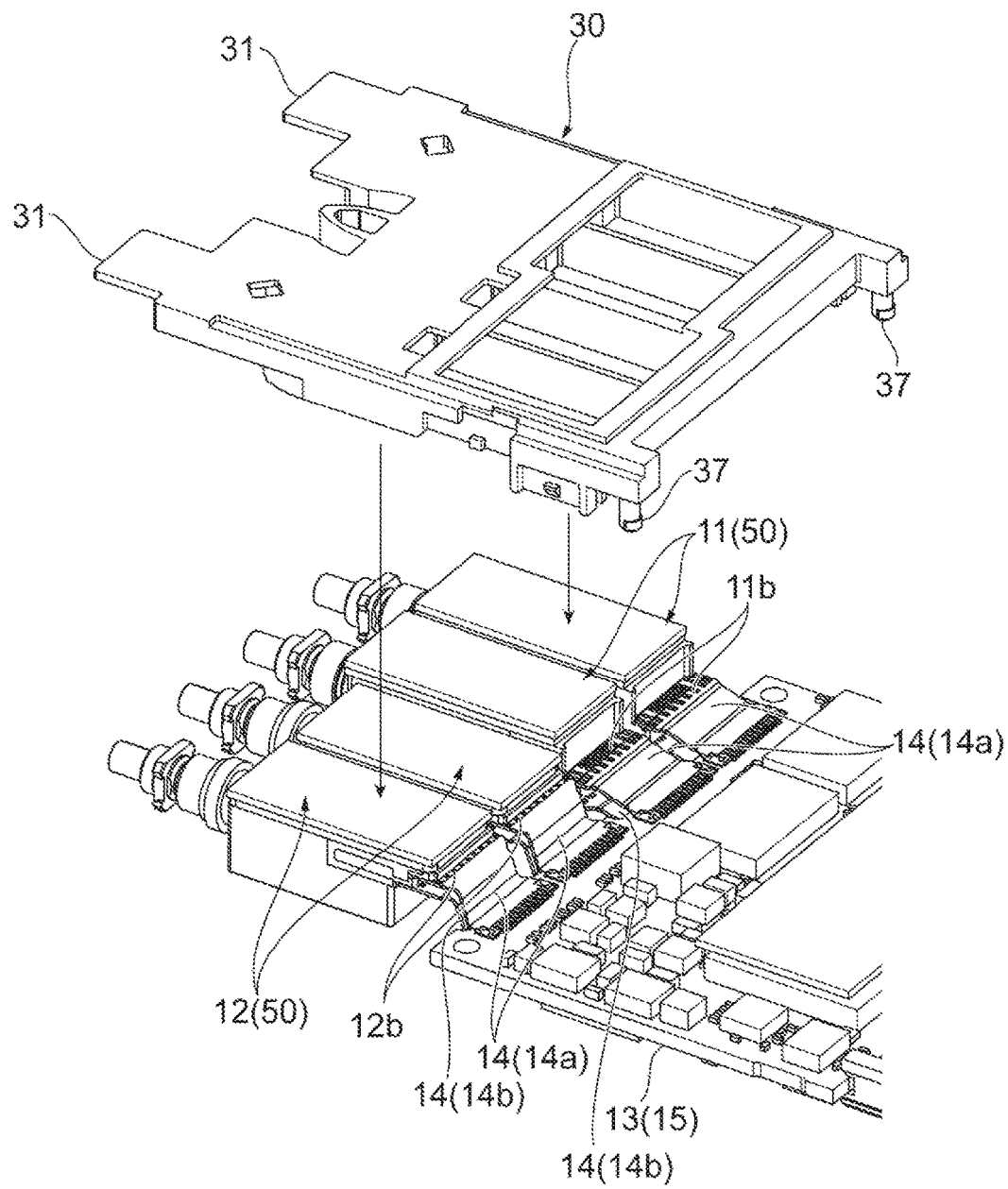
FIG. 10 is a perspective view illustrating OSAs, the circuit board, and the first holding member.

Connection between the OSAs 50 and the circuit board 13 using the FPCs 14 will be described below. FIG. 10 illustrates a state in which the first holding member 30 is assembled into the circuit board (the printed board) 13 after the OSAs 50 and the circuit board 13 are assembled. As illustrated in FIGS. 4 and 10, the FPCs 14 include first FPCs 14a that connect the surfaces of the terminals (upper terminals) 11b and 12b and the surface of the circuit board 13 and second FPCs 14b that connect the rear surfaces of the terminals (lower terminals) 11b and 12b and the rear surface of the circuit board 13. The position in the up-down direction at which the terminal 11b is drawn out of the TOSA 11 is different from the position in the up-down direction at which the terminal 12b is drawn out of the ROSA 12. Accordingly, the FPC 14 connected to the TOSA 11 is subjected to forming by a larger stress than the FPC 14 connected to the ROSA 12, otherwise the FPC 14 connected to the ROSA 12 is subjected to forming by a larger stress than the FPC 14 connected to the TOSA 11.

In FIG. 10, since a height difference between the surface of the terminal 12b and the surface of the circuit board 13 is large, a larger stress is applied to the FPC 14 connected to the ROSA 12. When various assembling operations of the optical transceiver 1 are performed in this state, it is considered that a large moment is applied particularly to the FPC 14 connected to the ROSA 12. Accordingly, in the optical transceiver 1, temporarily mounting the OSAs 50 on the first holding member 30 at the time of assembly allows a stress (the moment due to the weights of the TOSA 11 and the ROSA 12) applied to the FPCs 14 to be reduced.

Figure 11A:
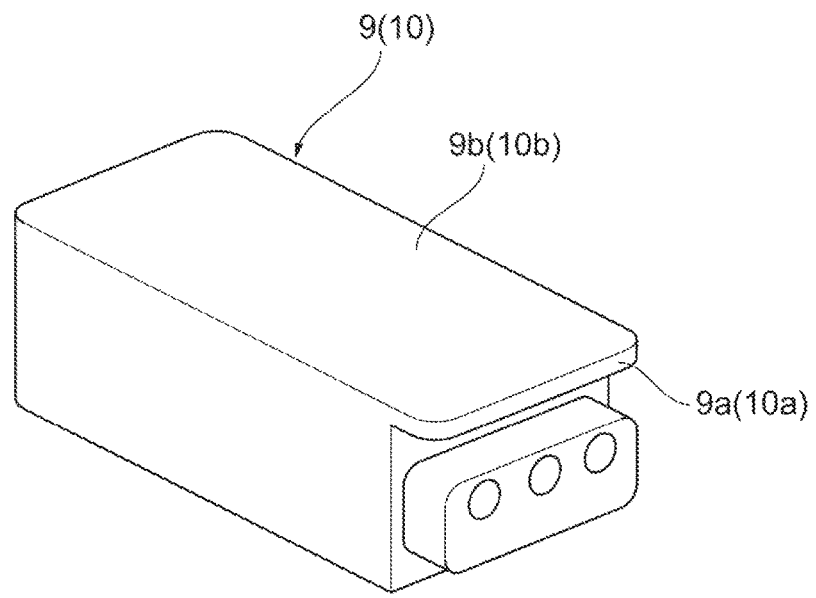
FIG. 11A is a perspective view illustrating an optical multiplexer (an optical demultiplexer)
Figure 11B:
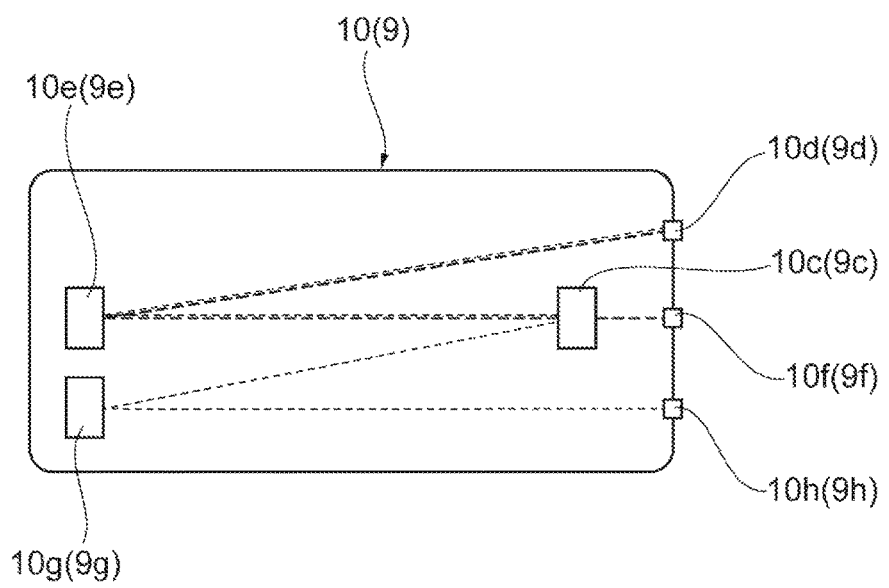
FIG. 11B is a diagram schematically illustrating an internal structure of the optical demultiplexer (the optical multiplexer)

FIG. 11A is a perspective view illustrating an appearance of the optical multiplexer 9. FIG. 11B is a diagram illustrating functions of the optical demultiplexer 10. Since the appearance of the optical demultiplexer 10 is the same as the appearance of the optical multiplexer 9, description of the appearance of the optical demultiplexer 10 will not be repeated. The optical multiplexer 9 is mounted in the optical transceiver 1 with the bottom 9b thereof facing upside. The circuit board 13, the OSAs 50, the first holding member 30, and the second holding member 40 can be assembled by temporarily fixing the bottom 9b of the optical multiplexer 9 to the protruding portions 31 of the first holding member 30.

The thickness of the protruding portion 9a is set to be slightly larger than the thickness of the concave portion 31a of the protruding portions 31. The protruding portion 9a is inserted into the concave portion 31a against a resistive force based on the elastic force of resin of the first holding member 30, that is, is press-fitted. The protruding portion 9a does not easily fall out of the concave portion 31a due to the press-fitting. Accordingly, the press-fitting prevents the optical multiplexer 9 from sliding out of the protruding portion 31 at the time of assembling the optical transceiver 1. Even after the upper housing 7 and the lower housing 8 are assembled, rattling of the optical multiplexer 9 can be curbed.

In this embodiment, the optical multiplexer 9 is temporarily fixed to the first holding member 30 using the protruding portion 9a and the concave portion 31a. However, the optical multiplexer 9 may be temporarily fixed to the first holding member 30 using an element other than the protruding portion 9a and the concave portion 31a. For example, the optical multiplexer 9 may be temporarily fixed to the first holding member 30 by providing a ring member surrounding the optical multiplexer 9 in the base of the protruding portion 31 and fitting the optical multiplexer 9 to the ring member.

As illustrated in FIG. 11B, the optical demultiplexer 10 includes a wavelength selection filter 10c. In the optical transceiver 1, optical signals of eight types of wavelengths which are set at intervals of 4 nm to 5 nm in the range of 1274 nm to 1310 nm are handled. The wavelength selection filter 10c separates a wavelength-multiplexed optical signal into which the optical signals of eight types of wavelengths are multiplexed into four optical signals (sub multiplexed optical signals) on a long wavelength side (1310 nm, 1305 nm, 1300 nm, 1295 nm) and four optical signals (sub multiplexed optical signals) on a short wavelength side (1274 nm, 1278 nm, 1282 nm, 1286 nm).

The wavelength selection filter 10c has a cutoff wavelength between 1286 nm and 1295 nm (for example, at 1290 nm). The wavelength selection filter 10c is obtained by forming a dielectric multilayer on a substantially transparent base material with respect to the cutoff wavelength. The wavelength selection function of the wavelength selection filter 10c depends on an incidence angle of light, that is, an angle formed by the normal line of the wavelength selection filter 10c and the optical axis of incident light (signal light). The best wavelength selection function is obtained when the incidence angle of light is 0°, and the wavelength selection function deteriorates as the incidence angle of light increases. Deterioration of the wavelength selection function means that a difference between a limit value of a transmission wavelength and a limit value of a reflection wavelength, for example, in the vicinity of the cutoff wavelength increases and filter characteristics deteriorate.

In the optical demultiplexer 10, wavelength-multiplexed light with eight multiplicity having the above-mentioned wavelengths is incident from a port 10d of the optical demultiplexer 10, is totally reflected by a mirror 10e, and is then incident on the wavelength selection filter 10c. In the wavelength-multiplexed light with eight multiplicity (the wavelength-multiplexed optical signals), four light components (sub multiplexed optical signals) on the long wavelength side (or four light components on the short wavelength side) are transmitted by the wavelength selection filter 10c and are output from a port 10f, and four light components (sub multiplexed optical signals) on the short wavelength side (or four light components on the long wavelength side) are reflected by the wavelength selection filter 10c. Four optical signals (sub multiplexed optical signals) reflected by the wavelength selection filter 10c are totally reflected by a mirror 10g and are output from a port 10h. The ports 10d, 10f, and 10h are provided with a collimating lens (not illustrated), and a collimating optical system is employed in the optical demultiplexer 10. That is, the optical signals are reflected or transmitted in the collimated light state as described above.

The optical demultiplexer 10 has been described hitherto, and input and output of the optical demultiplexer 10 are inverted in the optical multiplexer 9. That is, four optical signals (sub multiplexed optical signals) on the long wavelength side (or four optical signals on the short wavelength side) are incident from a port 9h, are totally reflected by a mirror 9g, and are reflected again by a wavelength selection filter 9c. On the other hand, four optical signals (sub multiplexed optical signals) on the short wavelength side (or four optical signals on the long wavelength side) are incident from a port 9f and is transmitted by the wavelength selection filter 9c. Four signal light components reflected by the wavelength selection filter 9c and four signal light components transmitted by the wavelength selection filter 9c are totally reflected by the mirror 9e and are then output as wavelength-multiplexed optical signals from a port 9d. According to this configuration, optical components mounted in the optical multiplexer 9 can employ the same optical components as mounted in the optical demultiplexer 10.

Figure 12:
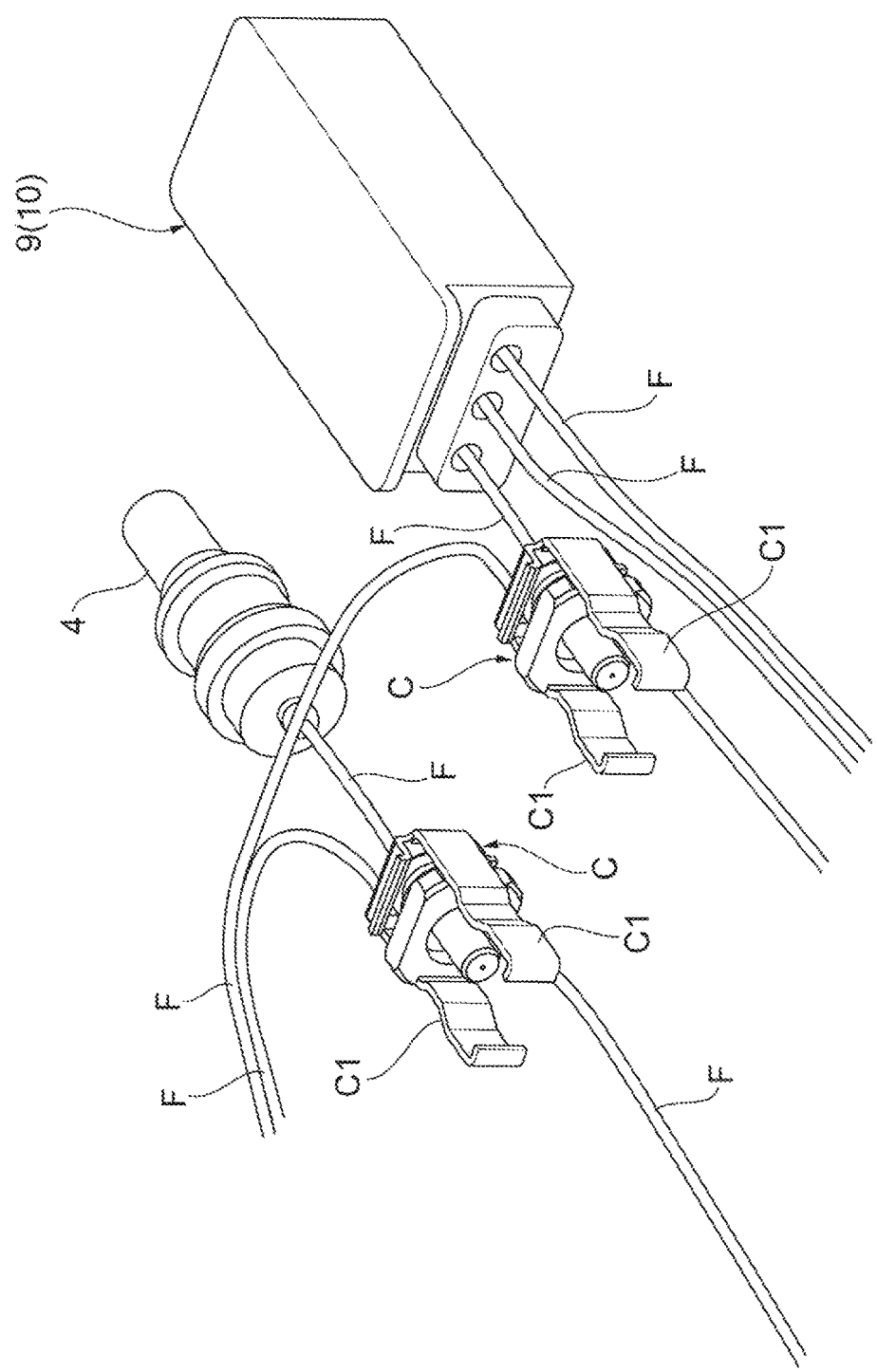
FIG. 12 is a perspective view illustrating the optical multiplexer (the optical demultiplexer), internal fibers, and simple connectors.

FIG. 12 is a perspective view illustrating the optical multiplexer 9 (the optical demultiplexer 10), the receptacle 4, the simple connectors C, and the internal fibers F. Connection of the internal fibers F to the optical multiplexer 9 and connection of the internal fibers F to the receptacle 4 are so-called pigtail connection (permanent connection). That is, the internal fibers F are optically connected directly to optical systems in the optical multiplexer 9 and the receptacle 4, and are undetachable from the optical multiplexer 9 and the receptacle 4. The simple connector C is attached to the OSA 50, and the OSA 50 and the internal fibers F are connected via the simple connector C. The simple connector C includes hook C1 on both sides and is connected to the OSA 50 via the hooks C1.

Since the optical multiplexer 9 (the optical demultiplexer 10) and the receptacle 4 are so-called optically passive components, an individual difference in performance between the components is relatively small On the other hand, since the OSA 50 has a semiconductor optical element (an active component) such as an LD or a PD mounted therein, an individual difference in performance between the components is relatively large. Accordingly, it is preferable that the OSA 50 be replaceable in comparison with the passive components. Accordingly, connecting the OSA 50 using the simple connector C each OSA 50 to be independently and easily replaced.

Figure 13:
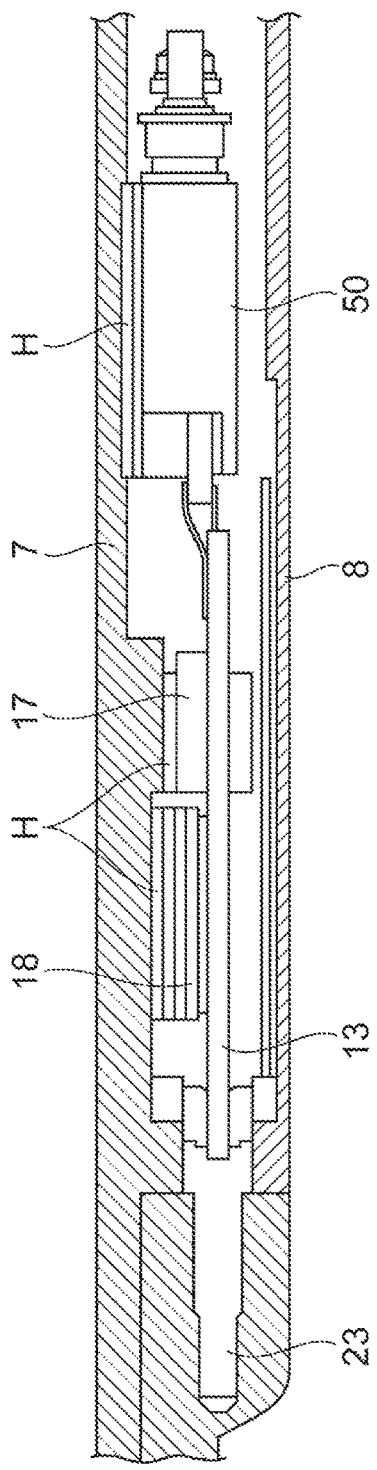
FIG. 13 is a sectional view illustrating OSAs, the circuit board, and a circuit which is mounted on the circuit board in a housing.

Circuit components (active components) which are mounted on the circuit board 13 such as the OSAs 50, the LD driver 17, and the DSP 18 generate Joule heat at the time of operation thereof. Accordingly, as illustrated in FIG. 13, heat dissipation surfaces of the OSAs 50, the LD driver 17, the DSP 18 or the like are disposed close to the upper housing 7 which comes in contact with a heat sink H. Accordingly, a heat dissipation path with good thermal conductivity of the OSAs 50, the LD driver 17, the DSP 18 or the like to the upper housing 7 is formed.

The circuit board (the printed board) 13 has a slight inclination with respect to a horizontal plane (a plane extending in the forward-rearward direction and the right-left direction). However, by applying a sheet or a gel having elasticity and heat conductivity as a heat sink H between the upper housing 7 and the LD driver 17 and the DSP 18 or the like, tolerance of the circuit board 13 due to the inclination is canceled.

Figure 14:
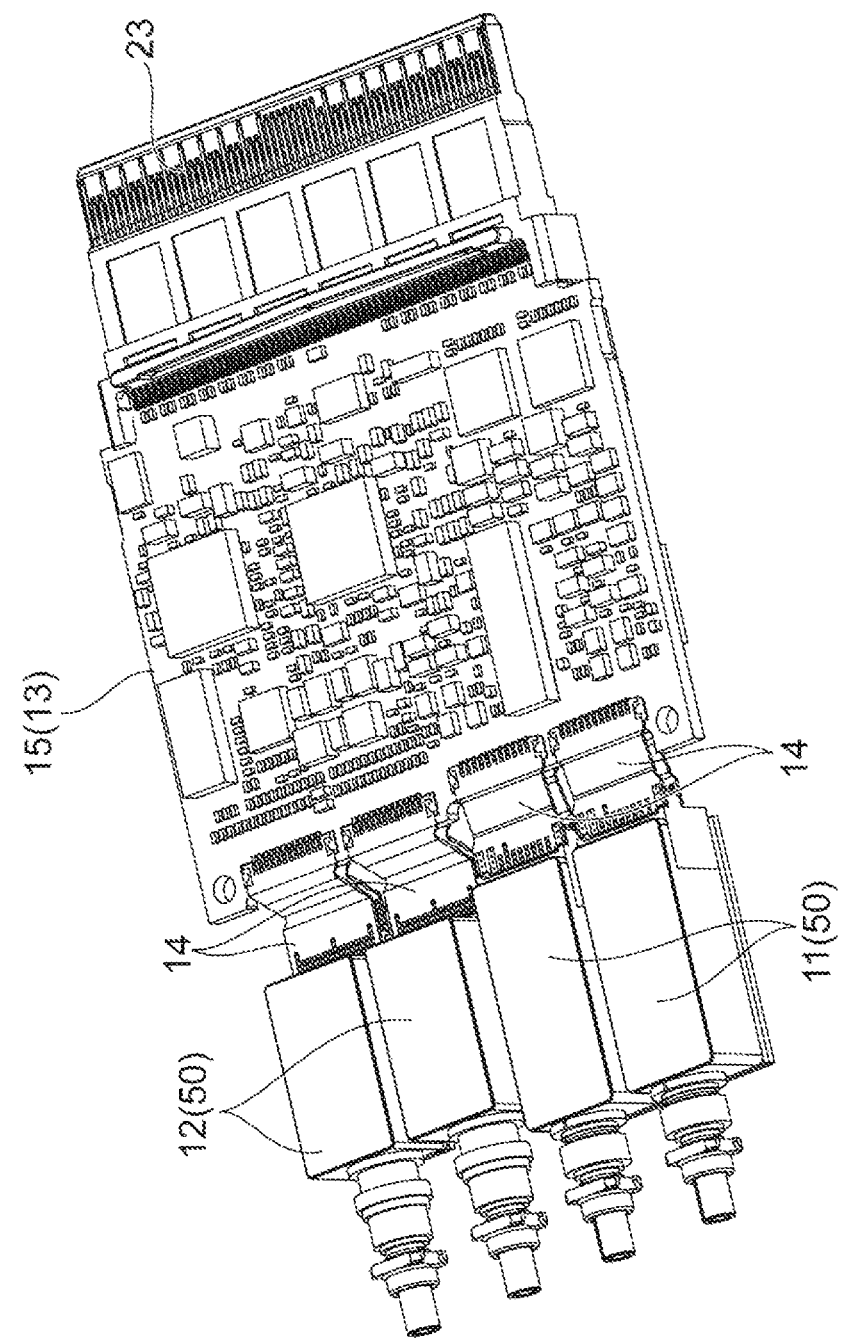
FIG. 14 is a perspective view illustrating OSAs, FPCs, and the circuit board.

Assembly of the optical transceiver 1 will be described below. FIG. 14 illustrates the rear surface of the first circuit board (the first printed board) 15 and the top surfaces of the OSAs 50. First, as illustrated in FIG. 14, the first circuit board 15 and the OSAs 50 are electrically connected to each other (a first step). Specifically, the first circuit board 15 in which circuit components are mounted on both surfaces and the OSAs 50 are connected to each other by the FPCs 14.

At this time, the FPCs 14 are subjected to forming Specifically, flexible portions of the FPCs 14 connected to the ROSAs 12 are bent more greatly than flexible portions of the FPCs 14 connected to the TOSAs 11. Thereafter, the FPCs 14 are soldered to the terminals 11b and 12b of the OSAs 50 and pads of the first circuit board 15 to electrically connect both.

Figure 15:
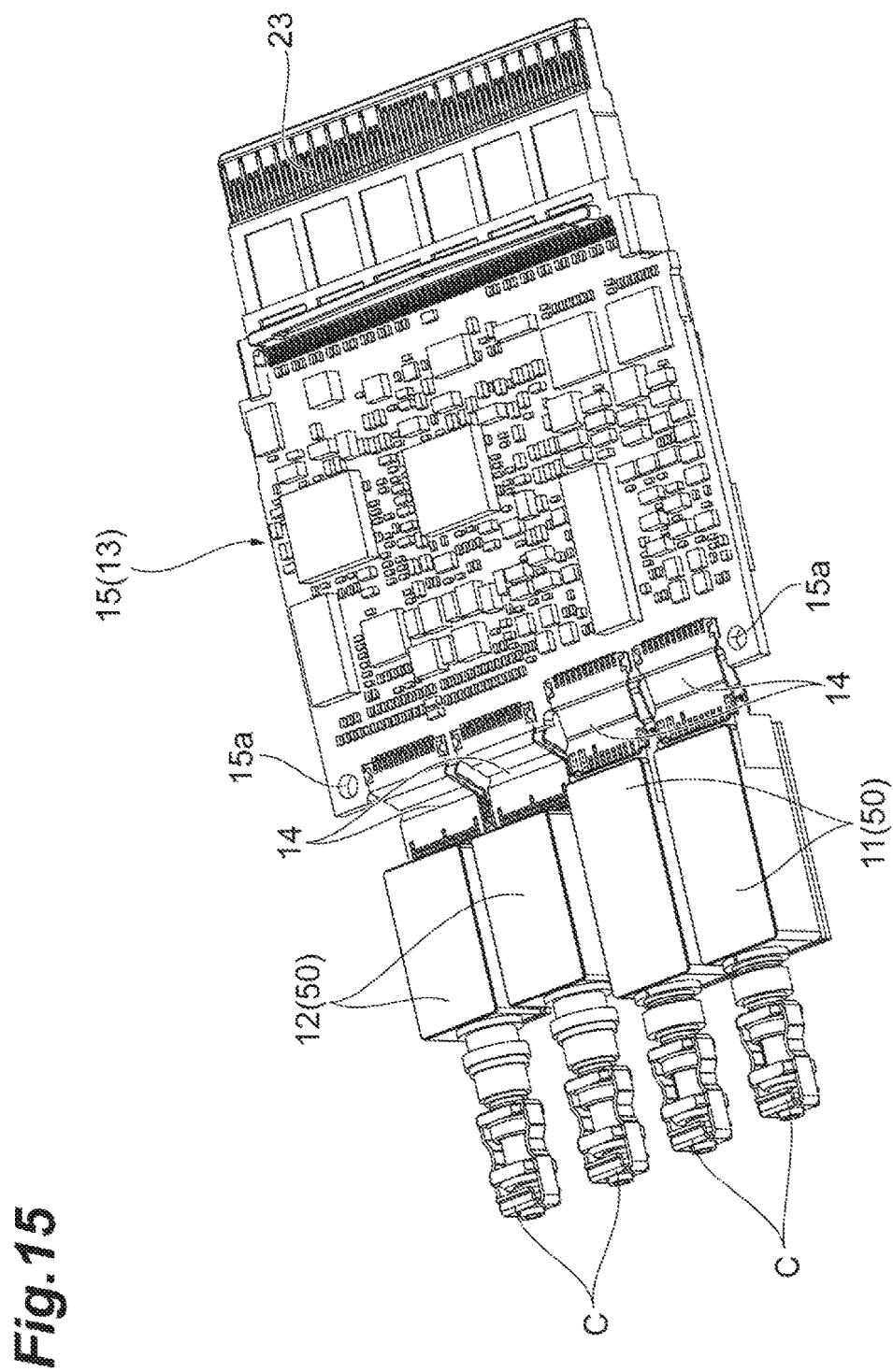
FIG. 15 is a perspective view illustrating a state in which simple connectors are attached to the OSAs illustrated in FIG. 14.

Then, as illustrated in FIG. 15, the simple connectors C are attached to the sleeves of the OSAs 50 (a second step). Although not illustrated in FIG. 15, the internal fibers F are connected to the simple connectors C. Then, as illustrated in FIG. 16, the first holding member 30 is assembled into the first circuit board 15 while holding the OSAs 50 (a third step).

At this time, the protrusions 37 at the rear end of the first holding member 30 are inserted into open holes 15a formed in the first circuit board 15. The diameter of the tips of the protrusions 37 is set to be larger than the diameter of the open holes 15a and thus the protrusions 37 are prevented from falling out of the open holes 15a. An engagement between the protrusions 37 and the open holes 15a limits movement of the first holding member 30 in the forward-rearward direction (longitudinal direction) and the right-left direction with respect to the first circuit board 15. However, the engagement allows the first holding member 30 to move in the up-down direction within a predetermined range against the inclination of the circuit board (the printed board) 13 described above. Accordingly, such an unique engagement enables the first holding member 30 to be protected from stress caused when the tolerance of the circuit board 13 due to the inclination is canceled. The internal fibers F extend from the simple connectors C attached to the OSAs 50.

Figure 16:
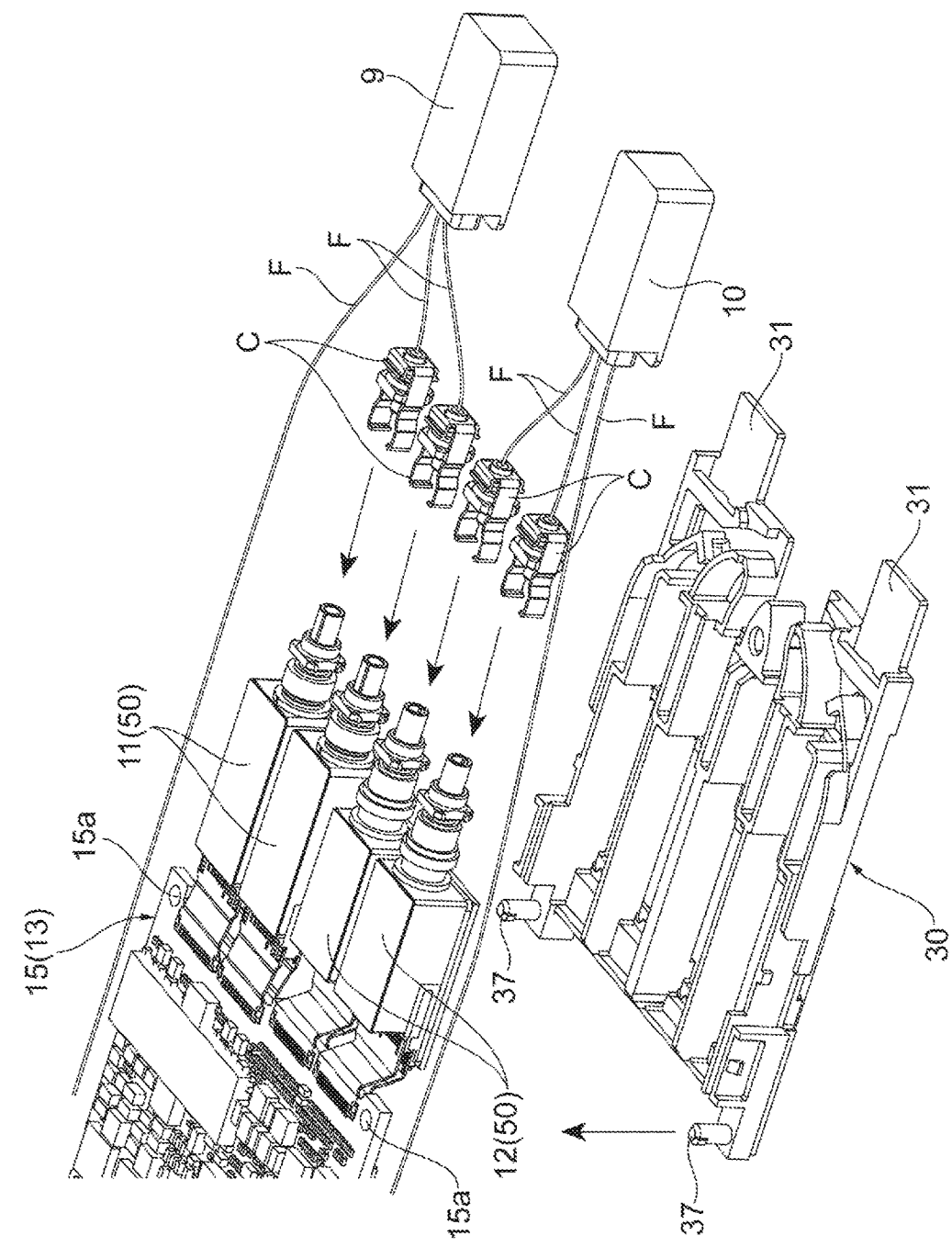
FIG. 16 is a perspective view illustrating a state in which simple connectors, the optical multiplexer (the optical demultiplexer), and the first holding member are attached to the OSAs.
Figure 17:
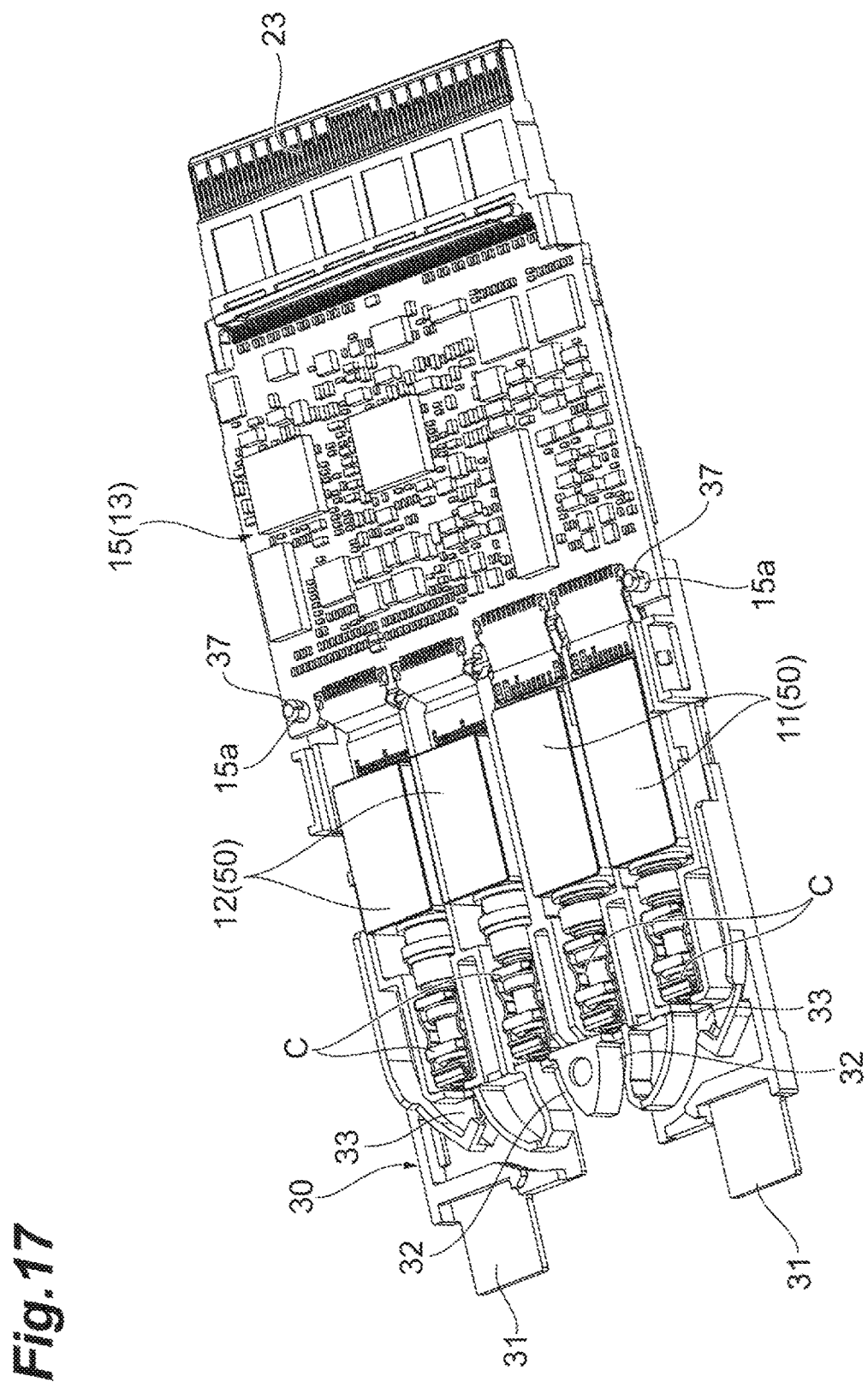
FIG. 17 is a perspective view illustrating a state in which the first holding member is attached to the OSAs illustrated in FIG. 16.
Figure 18:
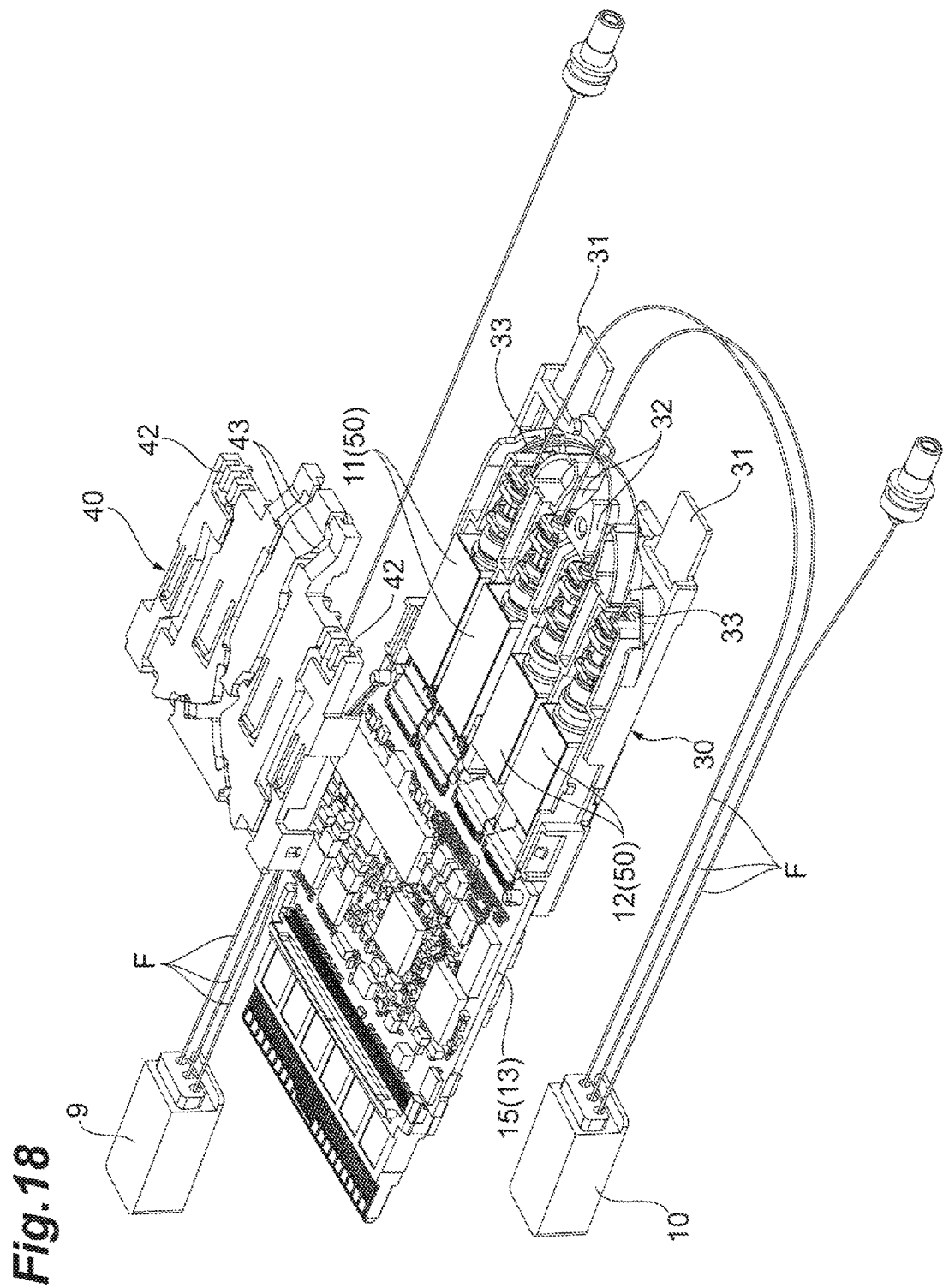
FIG. 18 is a perspective view illustrating a state in which the optical multiplexer (the optical demultiplexer) and the second holding member are attached to components illustrated in FIG. 17.

Then, in the state illustrated in FIGS. 16 and 17, the internal fibers F drawn forward out of the simple connectors C are guided in the grooves 32 and 33 of the first holding member 30 (a fourth step). Specifically, as illustrated in FIG. 18, the inner internal fibers F on the right and left sides are inserted into the grooves (guides) 32, the outer internal fibers F on the right and left sides are inserted into the grooves (guides) 33, and both internal fibers are bent to the opposite sides. Then, the optical multiplexer 9 and the optical demultiplexer 10 are moved to the circuit board 13.

Figure 19:
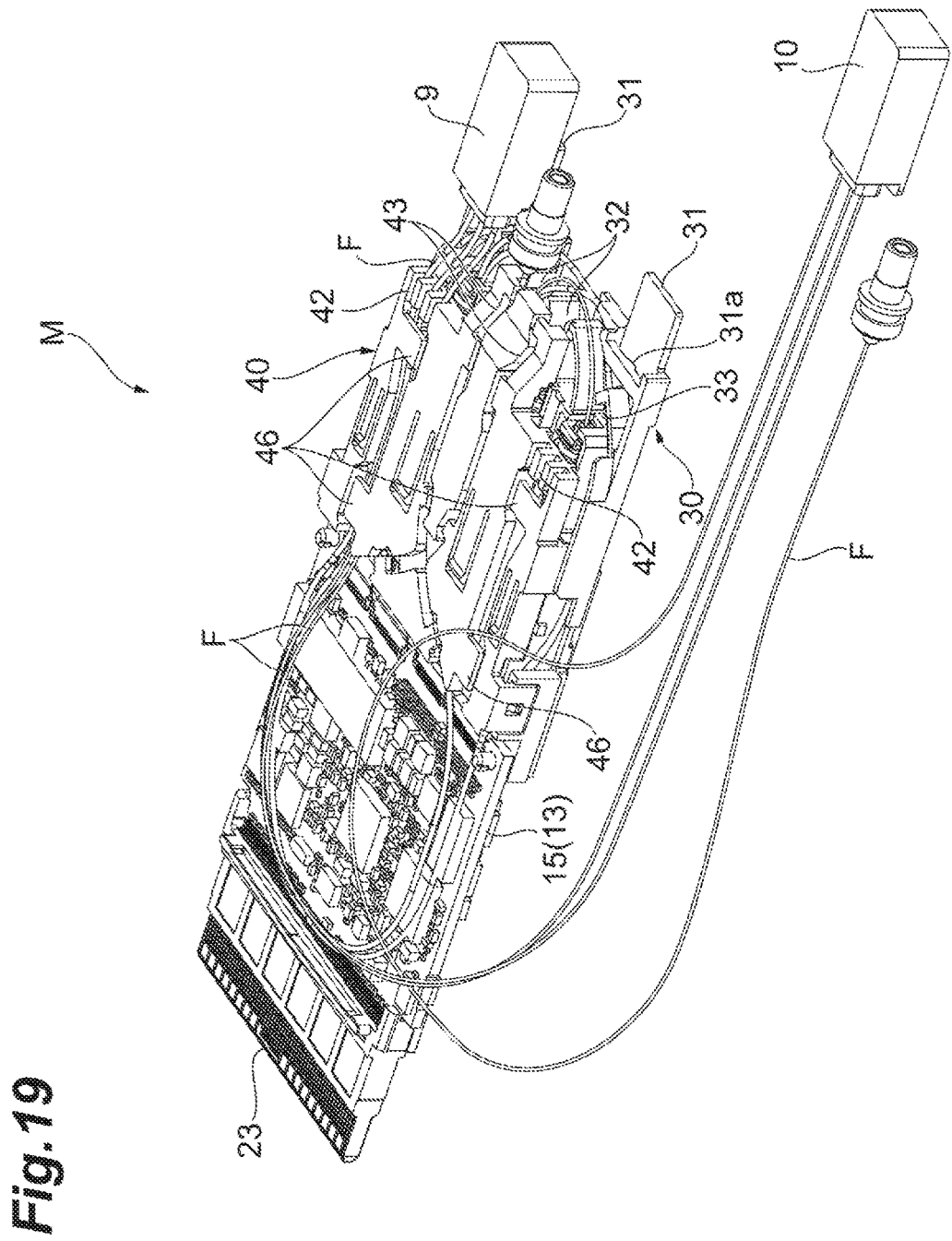
FIG. 19 is a perspective view illustrating a state in which the optical multiplexer (the optical demultiplexer) is temporarily fixed to the first holding member to assemble an intermediate assembly.

Then, the second holding member 40 is assembled into the first holding member 30. At this time, as illustrated in FIG. 19, the internal fibers F are curved greatly to the opposite sides in the right-left direction and folded back above the circuit board 13. Then, the internal fibers F connected to the receptacle 4 are inserted into the grooves 43, and the internal fibers F connected to the optical multiplexer 9 and the optical demultiplexer 10 are inserted into the grooves 42 (a fifth step).

The optical multiplexer 9 and the optical demultiplexer 10 are temporarily fixed to the protruding portions 31 to hold the optical multiplexer 9 and the optical demultiplexer 10 using the first holding member 30 (a sixth step). At this time, the protruding portions 9a and 10a are inserted into the concave portions 31a to temporarily fix the optical multiplexer 9 and the optical demultiplexer 10 onto the protruding portions 31.

This assembly is performed outside the housing 2. Accordingly, an intermediate assembly M including the circuit board 13, the OSA 50, the simple connectors C, the first holding member 30, the second holding member 40, the optical multiplexer 9, and the optical demultiplexer 10 can be efficiently assembled outside the housing 2 (a step of assembling an intermediate assembly).

This assembly method allows the internal fibers F to be handled with a high degree of freedom outside the housing 2 and prevents guiding of the internal fibers F (insertion into the guide grooves or curving above the circuit board 13) from being constrained by the housing 2. Accordingly, when the internal fibers F are guided, it is possible to efficiently house the internal fibers F in the grooves 32, 33, 42, and 43 of the first holding member 30 and the second holding member 40.

Since a plurality of protruding portions 46 are provided in the grooves 42 and 43, the protruding portions 46 can prevent the internal fibers F housed in the grooves from falling out (or jumping out) of the grooves 42 and 43. In a case that the optical multiplexer 9 and the optical demultiplexer 10 have larger weights, temporarily fixing the optical multiplexer 9 and the optical demultiplexer 10 to the first holding member 30 allows a stress applied to the bases of the internal fibers F connected to the optical multiplexer 9 and the optical demultiplexer 10 to be reduced.

Figure 20:
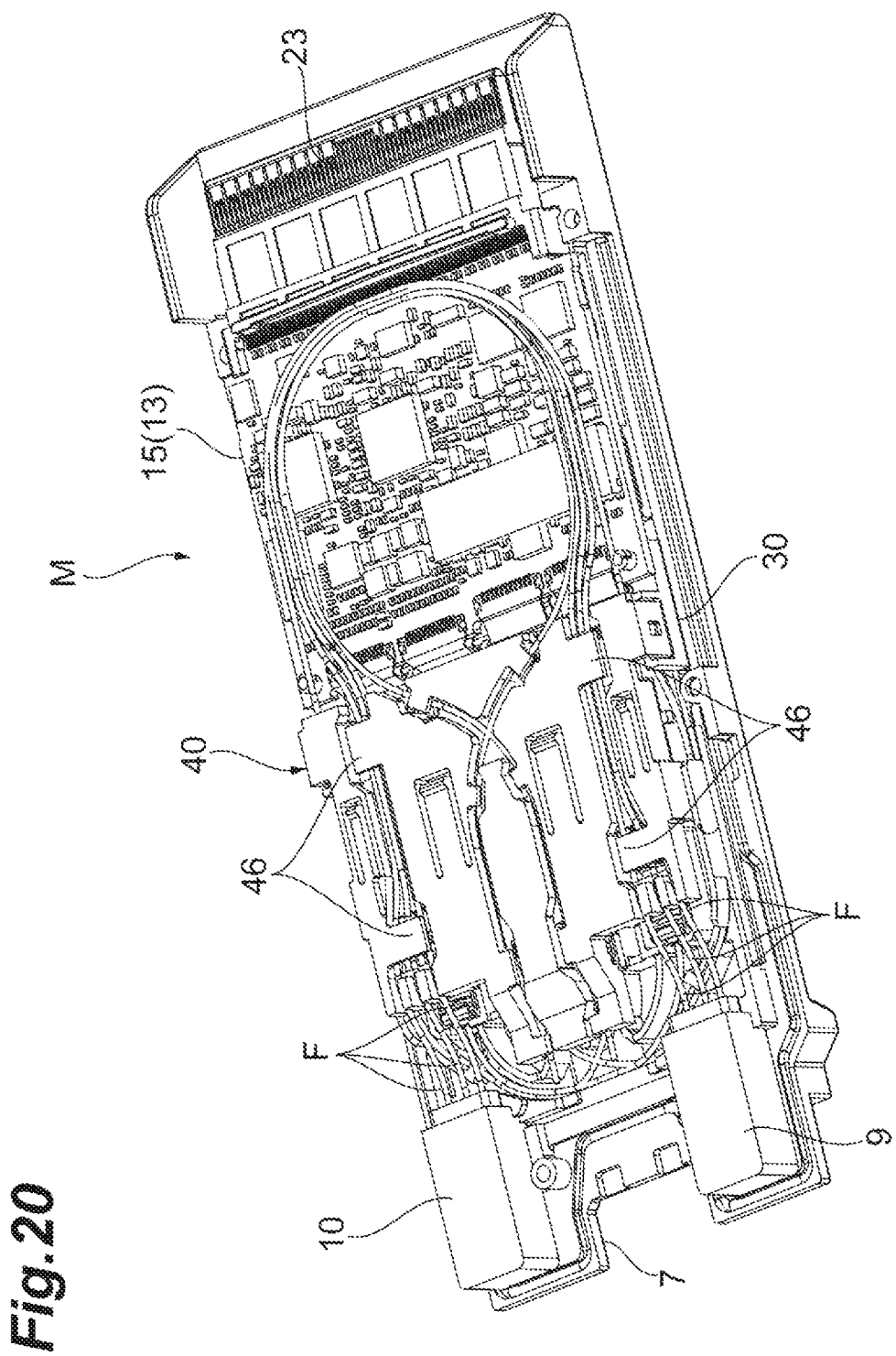
FIG. 20 is a perspective view illustrating a state in which the intermediate assembly illustrated in FIG. 19 is accommodated in an upper housing.
Figure 21:
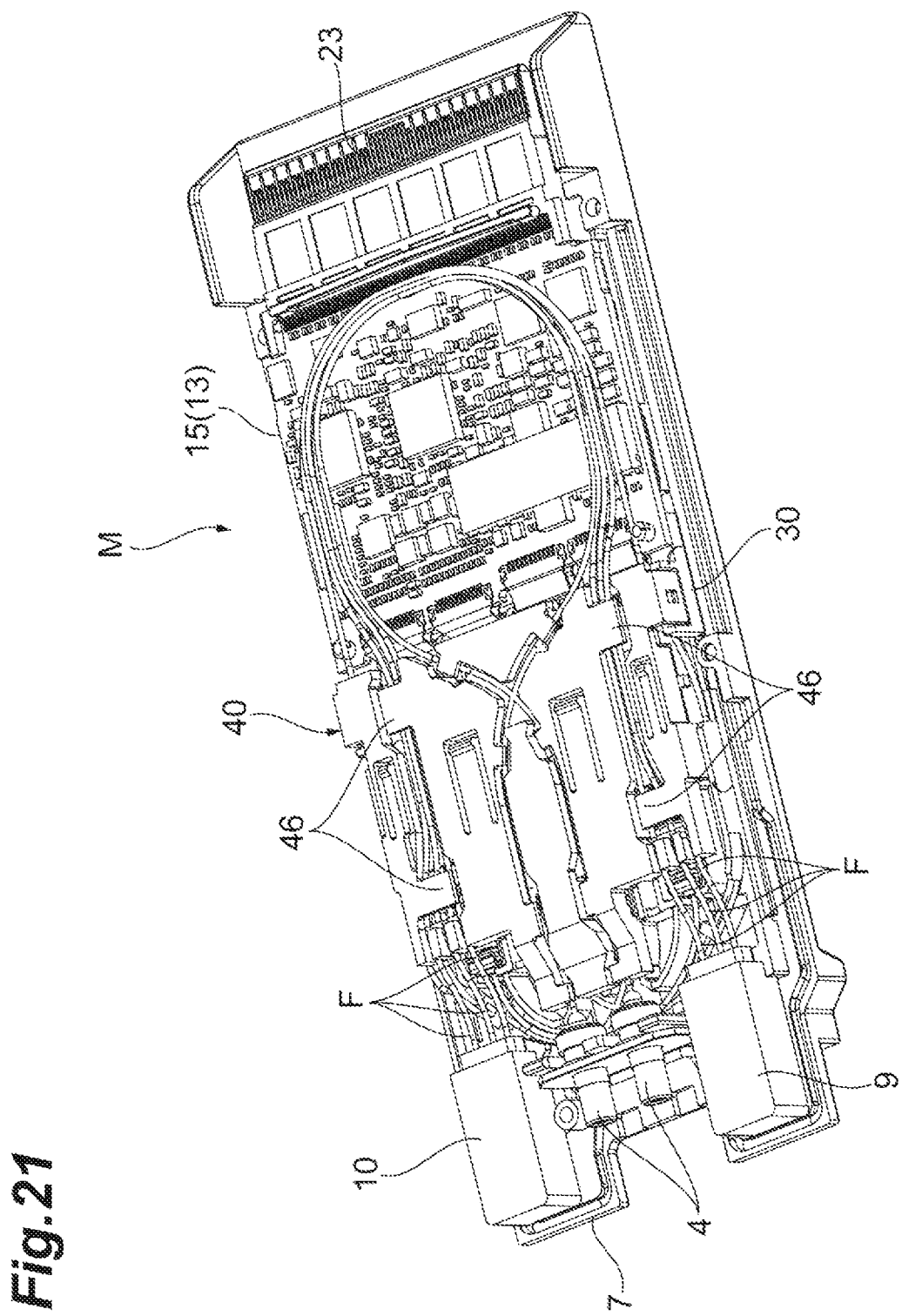
FIG. 21 is a perspective view illustrating a state in which a receptacle is mounted in the upper housing illustrated in FIG. 20.

After the intermediate assembly M has been assembled, the intermediate assembly M is disposed on the upper housing 7 as illustrated in FIG. 20. Subsequently, as illustrated in FIG. 21, the two receptacles 4 are disposed at the front end at the center in the right-left direction of the upper housing 7 (a seventh step). A structure for defining the mounting positions of the receptacles 4 is not provided in the inner surface of the upper housing 7. The structure is provided in the inner surface of the lower housing 8 and the positions of the receptacles 4 are defined by assembling the lower housing 8 into the upper housing 7.

At the time of assembly of the receptacles 4 into the lower housing 8, the sleeve of each receptacle 4 is inserted through a hole portion which is opened in the lower housing 8. At this time, moving the whole unit including the receptacles 4 forward allows the sleeve to be taken into the lower housing 8. A component group including the upper housing 7, the lower housing 8, the optical multiplexer 9, the optical demultiplexer 10, the receptacles 4, the first holding member 30, the second holding member 40, the OSAs 50, and the circuit board 13 which is acquired by such taking is formed as a unit, and the positional relationship between the components is maintained even in an upside-down state, whereby the resultant can be easily handled.

Figure 22:
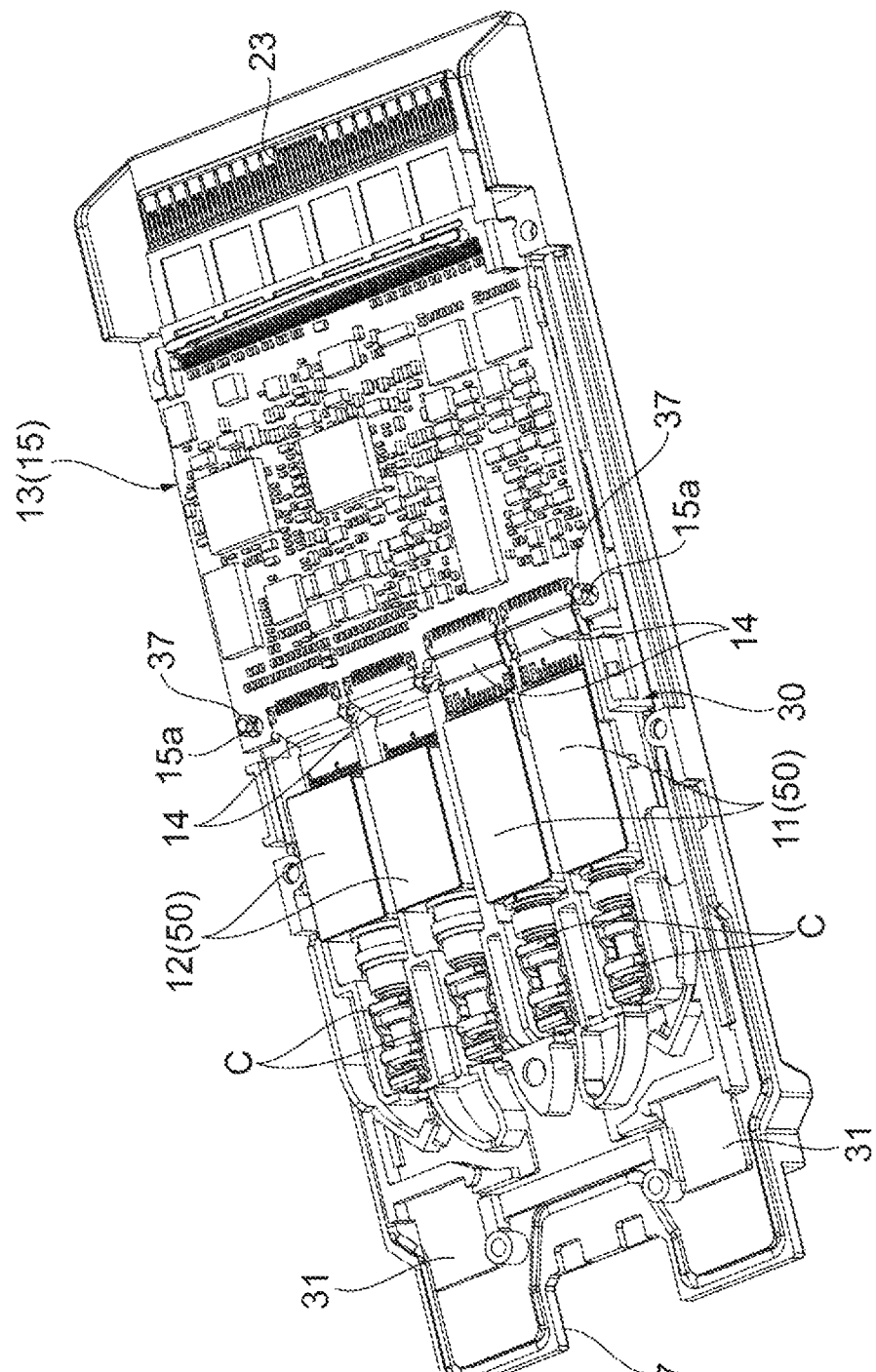
FIG. 22 is a perspective view illustrating an example in which the components illustrated in FIG. 15 are first accommodated in the upper housing.

While embodiments of the optical transceiver and the manufacturing method thereof have been described above, the invention is not limited to the embodiments. That is, it will be easily understood by those skilled in the art that various modifications and changes are possible within the scope of the gist of the invention described in the appended claims For example, the shapes of the first holding member 30 and the second holding member 40 can be appropriately changed. A single holding member may be provided instead of the first holding member 30 and the second holding member 40. The assembly sequence of the optical transceiver can be appropriately changed. As illustrated in FIG. 22, the first holding member 30 and the upper housing 7 may be assembled in the state in which the simple connectors C are attached to the OSAs 50 as illustrated in FIG. 15.

Figure 23:
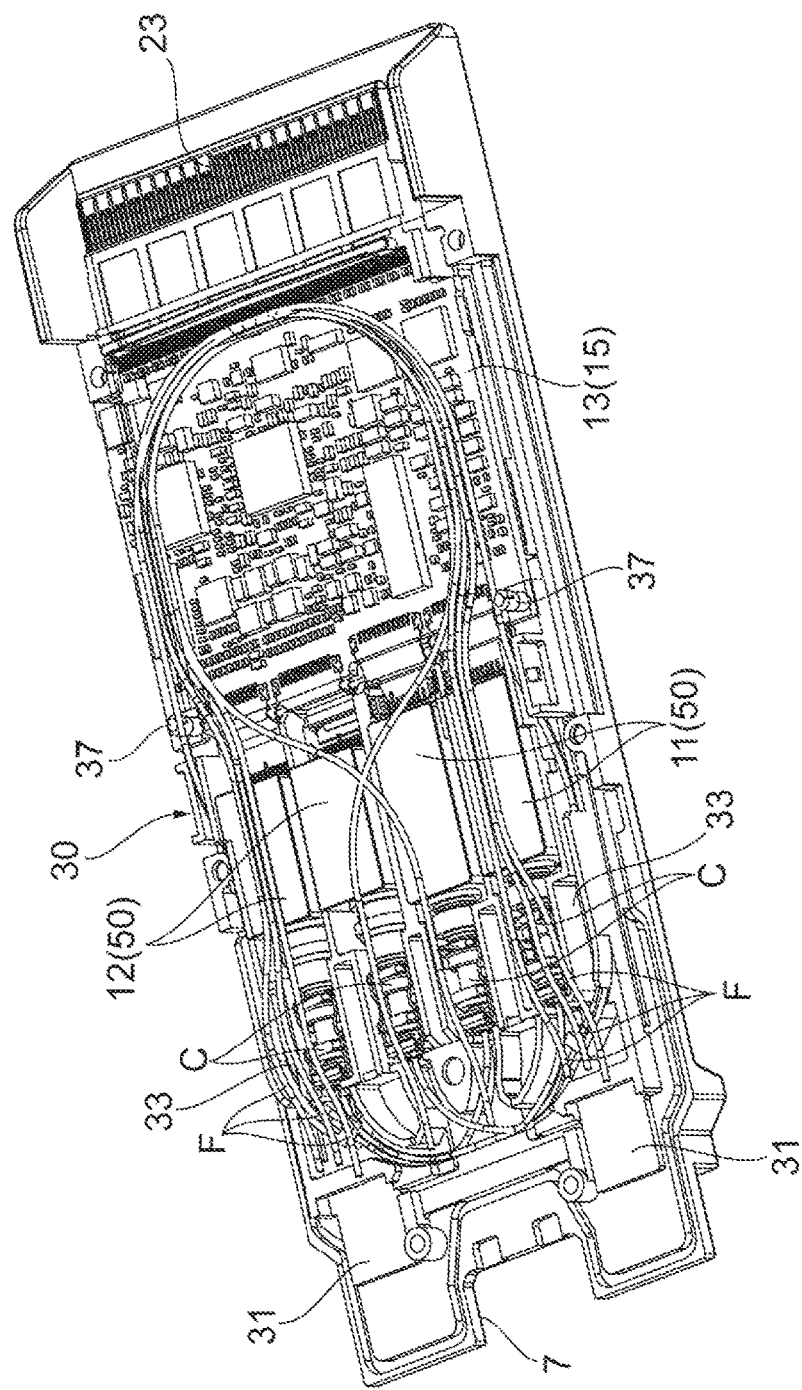
FIG. 23 is a perspective view illustrating a state in which internal fibers are wired on the OSAs and the circuit board illustrated in FIG. 22.

In this case, as illustrated in FIG. 23, four internal fibers F are crossed by two internal fibers in the front of the housing 7 after the first to fourth steps are performed to house the four internal fibers F in the grooves 32 and 33. Then, the fourth internal fibers F are drawn out to the side walls of the upper housing 7 which are located on the opposite sides in the right and left direction.

Thereafter, the internal fibers F are arranged on the outer side of the right and left sides of the upper housing 7, and the internal fibers F are detoured (are bent and folded back with a large radius of curvature) to the position of the circuit board 13. At this time, causing the internal fibers F to pass outside the wall portion located at the outermost of the grooves 33 of the first holding member 30 allows the curvature of the internal fibers F to be suppressed to be equal to or less than a prescribed value.

After the internal fibers F are drawn out to above the circuit board 13, the second holding member 40 is assembled into the first holding member 30 as illustrated in FIG. 20. As described above, after the circuit board 13, the OSAs 50, the simple connectors C, the first holding member 30, and the second holding member 40 are mounted in the upper housing 7, the optical multiplexer 9 (the optical demultiplexer 10) is supported by the first holding member 30 and the fifth step is performed. Thereafter, assembly of the first optical transceiver 1 can be completed through the same sequence as described above.

What is claimed is:

1. An optical transceiver comprising:
   an optical sub assembly (OSA) configured to perform photoelectric conversion between an optical signal and an electrical signal;
   a flexible printed circuit (FPC) configured to transmit the electrical signal;
   a circuit board including a circuit that is electrically connected to the OSA via the FPC;
   a holding member that is attached to the circuit board and holds the OSA;
   an internal fiber for transmitting the optical signal;
   a receptacle that is optically connected to the OSA via the internal fiber and configured to receive an external optical connector for transmitting or receiving the optical signal; and
   a housing that houses the OSA, the FPC, the circuit board, the holding member, the internal fiber, and the receptacle.

2. The optical transceiver according to claim 1, wherein the OSA includes a transmitter optical sub assembly (TOSA) and a receiver optical sub assembly (ROSA), wherein the TOSA and the ROSA each include a package having
   a rectangular parallelepiped shape, and are disposed between the receptacle and the circuit board in a longitudinal direction of the optical transceiver, and
   wherein the package includes a terminal on a surface facing the circuit board, and the terminal is electrically connected to the FPC.

3. The optical transceiver according to claim 2, wherein the package further includes a surface that touches an inner surface of the housing through an opening formed in the holding member.

4. The optical transceiver according to claim 3,
wherein the holding member includes a first holding member and a second holding member,
wherein the first holding member includes the opening, and
wherein the second holding member includes a stress applying portion that presses the OSA against the inner surface of the housing.

5. The optical transceiver according to claim 2,
wherein the terminal has an upper terminal and a lower terminal,
wherein the FPC includes a first FPC that electrically connects the upper terminal to a surface of the circuit board and a second FPC that electrically connects the lower terminal to a rear surface of the circuit board.

6. An optical transceiver comprising:
a TOSA that converts a first electrical signal into a first optical signal;
an ROSA that converts a second optical signal into a second electrical signal;
a receptacle that receives an external optical connector for transmitting the first optical signal or receiving the second optical signal via the external optical connector;
an internal fiber that optically connects one of the ROSA and the TOSA to the receptacle;
a circuit board includes a circuit that processes the first electrical signal and the second electrical signal; and
a holding member that is attached to the circuit board and holds the ROSA and the TOSA,
wherein the holding member includes a guide that guides the internal fiber.

7. The optical transceiver according to claim 6,
wherein the TOSA or the ROSA is optically connected to one end of the internal fiber by a simple connector, and
wherein the receptacle is optically connected to another end of the internal fiber in a pigtail manner.

8. The optical transceiver according to claim 7, further comprising:
an optical multiplexer that multiplexes the first optical signal; and
an optical demultiplexer that generates the second optical signal,
wherein the internal fiber includes a first internal fiber and a second internal fiber, and
wherein one of the optical multiplexer and the optical demultiplexer is optically connected to the receptacle via the first internal fiber and is optically connected to the simple connector via the second internal fiber.

9. The optical transceiver according to claim 8,
wherein the holding member includes a first guide that faces the receptacle and houses the first internal fiber and a second guide that faces one of the optical multiplexer and the optical demultiplexer and houses the second internal fiber,
wherein the first internal fiber is drawn out of the receptacle, extends in the first guide, is bent and folded back on the circuit board, and is optically connected to the one of the optical multiplexer and the optical demultiplexer, and
wherein the second internal fiber is drawn out of the one of the optical multiplexer and the optical demultiplexer, extends in the second guide, is bent and folded back on the circuit board, and is connected to the simple connector.

10. The optical transceiver according to claim 9,
wherein the second internal fiber extends from the circuit board to the one of the optical multiplexer and the optical demultiplexer and extends outside of the holding member.

11. The optical transceiver according to claim 9,
wherein the second internal fiber has a curve along a wall portion of the holding member and the curve has a curvature less than 20 mm.

12. The optical transceiver according to claim 11,
wherein the holding member includes the first guide and the second guide on a bottom surface thereof and includes the wall portion on a side opposite to the bottom surface.

13. A method of manufacturing an optical transceiver including a circuit board, an optical sub assembly (OSA), a holding member that is attached to the circuit board and holds the OSA, and an internal fiber that optically connects the OSA to an optical component, the method comprising:
a first step of electrically connecting the circuit board and the OSA to each other;
a second step of optically connecting the internal fiber to a simple connector attached to the OSA;
a third step of attaching the holding member to the circuit board while holding the OSA;
a fourth step of housing the internal fiber in a guide that is provided in the holding member; and
a fifth step of housing the optical component in the holding member.

14. The method of manufacturing an optical transceiver according to claim 13,
wherein the optical transceiver further includes a housing, and
wherein the method further includes a step of assembling an intermediate assembly that integrally temporarily holds the circuit board, the OSA, the simple connector, the holding member, the internal fiber, and the optical component by performing the first step, the second step, the third step, the fourth step, and the fifth step outside the housing.

15. The method of manufacturing an optical transceiver according to claim 13,
wherein the optical transceiver further includes a housing, and
wherein the circuit board, the OSA, the simple connector, and the holding member are assembled outside the housing by performing the first step, the second step, the third step, and the fourth step, and performing the fifth step after the circuit board, the OSA, the simple connector, and the holding member which are integrally assembled have been housed in the housing.

16. The method of manufacturing an optical transceiver according to claim 13,
wherein the optical transceiver further includes a housing and a receptacle,
wherein the internal fiber includes a first internal fiber and a second internal fiber,
wherein the guide includes a first guide and a second guide,
wherein the fourth step includes a step of housing the first internal fiber in the first guide,
wherein the method further includes:, after the fourth step,
a sixth step of housing the second internal fiber in the second guide; and
a seventh step of attaching the receptacle in the housing.

17. The method of manufacturing an optical transceiver according to claim 16,
   wherein the holding member includes a first holding member and a second holding member, and
   wherein the first guide is provided in the first holding member and the second guide is provided in the second holding member.

* * * * *